US012617966B2

(12) United States Patent
Kishimoto et al.

(10) Patent No.: US 12,617,966 B2
(45) Date of Patent: May 5, 2026

(54) COMPOSITION

(71) Applicant: SAMSUNG ELECTRONICS CO., LTD., Suwon-si (KR)

(72) Inventors: Tadashi Kishimoto, Tokyo (JP); Yuki Hirayama, Tokyo (JP); Julian Burschka, Darmstadt (DE); Teruaki Suzuki, Tokyo (JP); Nils Greinert, Darmstadt (DE); Denis Glozman, Jerusalem (IL); Ehud Shaviv, Jerusalem (IL); Yaron Aviv, Jerusalem (IL); Elizaveta Kossoy, Jerusalem (IL)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 154 days.

(21) Appl. No.: 18/031,376

(22) PCT Filed: Oct. 11, 2021

(86) PCT No.: PCT/EP2021/078008

§ 371 (c)(1),
(2) Date: Apr. 12, 2023

(87) PCT Pub. No.: WO2022/078938

PCT Pub. Date: Apr. 21, 2022

(65) Prior Publication Data

US 2023/0392033 A1 Dec. 7, 2023

(30) Foreign Application Priority Data

Oct. 12, 2020 (EP) .................................... 20201305
Feb. 16, 2021 (EP) .................................... 21157392

(51) Int. Cl.
*C09D 11/38* (2014.01)
*B41M 5/40* (2006.01)
(Continued)

(52) U.S. Cl.
CPC ............. *C09D 11/38* (2013.01); *B41M 5/405* (2013.01); *C09D 11/033* (2013.01);
(Continued)

(58) Field of Classification Search
CPC . C08F 2/44; C08F 2/50; C09D 11/033; C09D 11/037; C09D 11/101;
(Continued)

(56) References Cited

U.S. PATENT DOCUMENTS 7,588,828 B2 9/2009 Mushtaq et al.
8,679,543 B2 3/2014 Bartel et al.
(Continued)

FOREIGN PATENT DOCUMENTS

CN 109535836 A 3/2019
JP 2018-512614 A 5/2018
(Continued)

OTHER PUBLICATIONS

International Search Report PCT/EP2021/078008 dated May 18, 2022 (pp. 1-7).
(Continued)

*Primary Examiner* — Lawrence D Ferguson
(74) *Attorney, Agent, or Firm* — Sughrue Mion, PLLC

(57) ABSTRACT

The present invention relates to a composition comprising at least one light emitting moiety.

20 Claims, 7 Drawing Sheets

(51) Int. Cl.

| | |
|---|---|
| ***C09D 11/033*** | (2014.01) |
| ***C09D 11/037*** | (2014.01) |
| ***C09D 11/101*** | (2014.01) |
| ***C09D 11/107*** | (2014.01) |
| ***C09D 11/322*** | (2014.01) |
| ***C09D 11/50*** | (2014.01) |
| ***G02F 1/13357*** | (2006.01) |
| ***H10K 59/38*** | (2023.01) |

(52) U.S. Cl.
CPC .......... *C09D 11/037* (2013.01); *C09D 11/101* (2013.01); *C09D 11/107* (2013.01); *C09D 11/322* (2013.01); *C09D 11/50* (2013.01); *G02F 1/133617* (2013.01); *H10K 59/38* (2023.02)

(58) Field of Classification Search
CPC ..... C09D 11/107; C09D 11/32; C09D 11/322; C09D 11/38; C09D 11/50; C09K 11/02; C09K 11/025; C09K 11/70; G02F 1/133617; H10K 59/38; B41M 5/405; Y02P 70/10
See application file for complete search history.

(56) References Cited

U.S. PATENT DOCUMENTS

| | | | |
|---|---|---|---|
| 9,529,228 | B2 | 12/2016 | Banin et al. |
| 10,509,319 | B2 | 12/2019 | Suzuki et al. |
| 11,269,255 | B2 | 3/2022 | Hirayama et al. |
| 11,579,527 | B2 | 2/2023 | Shibayama et al. |
| 2015/0098212 | A1 | 4/2015 | Won et al. |
| 2018/0046080 | A1 | 2/2018 | Suzuki et al. |
| 2018/0102449 | A1 | 4/2018 | Pschenitzka et al. |
| 2019/0218453 | A1 | 7/2019 | Qiu et al. |
| 2020/0017762 | A1 | 1/2020 | Mansei et al. |
| 2020/0157419 | A1 | 5/2020 | Kishimoto et al. |
| 2022/0204797 | A1 | 6/2022 | Kishimoto et al. |
| 2023/0052397 | A1 | 2/2023 | Hirayama et al. |

FOREIGN PATENT DOCUMENTS

| | | | |
|---|---|---|---|
| JP | 2019-532473 | A | 11/2019 |
| JP | 2020-525618 | A | 8/2020 |
| KR | 10-2015-0041581 | A | 4/2015 |
| KR | 10-2019-0062442 | A | 6/2019 |
| TW | 201910484 | A | 3/2019 |
| WO | 2015/166863 | A1 | 11/2015 |
| WO | 2016134820 | A1 | 9/2016 |
| WO | 2017054898 | A1 | 4/2017 |
| WO | 2018/056469 | A1 | 3/2018 |
| WO | 2019002239 | A1 | 1/2019 |
| WO | 2020208127 | A1 | 10/2020 |
| WO | 2021116139 | A1 | 6/2021 |

OTHER PUBLICATIONS

Communication issued on Aug. 6, 2025 by the Korean Intellectual Property Office in Korean Patent Application No. 10-2023-7015599.

Communication issued on Sep. 18, 2025 by the China National Intellectual Property Administration in Chinese Patent Application No. 202180069587.X.

Communication issued on Sep. 30, 2025 by the Japan Patent Office in Japanese Patent Application No. 2023-521899.

COMPOSITION

FIELD OF THE INVENTION

The present invention relates to a photo-reactive composition comprising at least one light emitting moiety, a layer, a color conversion device, process for fabricating a color conversion device, an optical device containing at least one color conversion device, method for fabricating a color conversion device and use of a composition.

BACKGROUND ART

WO 2017/054898 A1 describes a composition comprising red emission type nanocrystals, wetting and dispersing agent, propylene glycol monomethyl ether acetate as a solvent, an acryl polymer mixture including an acrylic unit including an acid group and a silane modified acrylic unit.

WO 2019/002239 A1 discloses a composition comprising a semiconducting light emitting nanoparticles, a polymer and a (meth)acrylate such as 1.4. cyclohexanedimethanol-monoacrylate having high viscosity around 90 cp.

PATENT LITERATURE

1. WO 2017/054898 A1
2. WO 2019/002239 A1

SUMMARY OF THE INVENTION

However, the inventors newly have found that there are still one or more of considerable problems for which improvement is desired, as listed below. $TiO_2$ particles that are typically used as scattering particles in QD inks have a rather high density and combined with the rather large particle size needed for efficient visible light scattering, sedimentation is a common issue. Sedimentation, often caused by aggregation, can lead to issues during ink-jet printing. Hence it is desired to develop an ink that requires less amount of $TiO_2$ or scattering particles in general to achieve high EQE, or better no $TiO_2$ or scattering particles in general to achieve high EQE.

Additionally, the addition of $TiO_2$ leads to a significant increase in viscosity. Therefore, it is desired to provide a QD ink with less or without $TiO_2$ or scattering particles in general which would therefore provide more flexibility for the ink design and selection and concentration of the other ink components.

The benefit of this invention is achieving higher EQE and lower BL for a QD ink without scattering particles or less amount of scattering particles compared to a reference ink, achieving higher haze value of a cured QD ink without scattering particles or less amount of scattering particles compared to a reference ink, and achieving higher haze value of a cured QD ink without scattering particles or less amount of scattering particles compared to a reference ink and higher EQE at the same time possibly realizing lower blue leakage at the same time, improved optical properties of bank, improved compatibility between a bank and a composition containing a light emitting moiety (e.g. QD ink), improved wetting properties and chemical stability towards a composition containing a light emitting moiety, less degradation of the bank structure upon bringing the composition containing a light emitting moiety into contact with the bank, Such degradation may be (partial or complete) dissolution of the bank structure by the QD ink formulation, delamination of the bank structure and/or intermixing of the bank and the QD ink. This would lead to a loss of integrity of the bank structure and/or a loss of the well-defined pixel structure. realizing adequate chemical resistance of the bank so that no degradation is observed upon filling the wells of the bank structure with QD Ink, realizing low curing temperature (e.g. 100° C.) properties of the bank, providing a bank having high resolution and/or excellent light shielding properties. Providing a bank composition configured to be developed even with a low-concentration alkaline developer other than an organic developer and is excellent also in environmental properties, improved homogeneous dispersion of semiconducting light emitting nanoparticles in the composition, improved homogeneous dispersion of scattering particles in the composition, preferably improved homogeneous dispersion of both semiconducting light emitting nanoparticles and scattering particles, more preferably improved homogeneous dispersion of semiconducting light emitting nanoparticles and/or scattering particles without solvent; composition having lower viscosity suitable for inkjet printing, preferably a composition which can keep lower viscosity even if it is mixed with high loading of semiconducting light emitting nanoparticles and/or scattering particles, even more preferably without solvent; composition having lower vaper pressure for large area uniform printing; improved QY and/or EQE of semiconducting light emitting nanoparticles in the composition, improved QY and/or EQE of semiconducting light emitting nanoparticles after printing; improved thermal stability; easy printing without clogging at a printing nozzle; easy handling of the composition, improved printing properties; simple fabrication process; improved absorbance of blue light; improved solidity of a later made from the composition after inkjet printing.

The inventors aimed to solve one or more of the above-mentioned problems.

Then it is found that a novel photo-reactive composition comprising at least one light emitting moiety, is configured to show a haze value of 15% or less in the liquid state, preferably said haze value is in the range from 15 to 0.01%, more preferably said haze value is in the range from 10 to 0.1%, even more preferably said haze value is in the range from 5 to 0.1%, and is configured to show the EQE value 20% or more in the cured state, preferably said EQE value is in the range from 20% to 99%, more preferably said EQE value is in the range from 30% to 50%, even more preferably said EQE value is in the range from 30% to 40%, preferably the composition contains scattering particles 5 wt % or less based on the total amount of the composition, more preferably it is in the range from 4 to even more preferably no scattering particles are in the composition, preferably the composition contains solid particles 5 wt % or less based on the total amount of the composition, wherein said sold particle is not the light emitting moiety, more preferably it is in the range from 4 to 0 wt %, even more preferably no sold particles other than the light emitting moiety are in the composition, preferably it is configured to show a haze value of more than 15% in the cured state, more preferably it is in the range from 16% to 99%, even more preferably it is in the range from 20% to 99%, furthermore preferably it is in the range from 20% to 90%, particularly preferably it is in the range from 30% to 85%.

In another aspect, the present invention also relates to a photo-reactive composition comprising at least one light emitting moiety, is configured to show a haze value of more than 15% in the cured state, more preferably it is in the range from 16% to 99%, even more preferably it is in the range from 20% to 99%, furthermore preferably it is in the range from 20% to 90%, particularly preferably it is in the range from 30% to 85% and is configured to show the EQE value 20% or more, preferably said EQE value is in the range from 20% to 99%, more preferably said EQE value is in the range from 30% to 50%, even more preferably said EQE value is in the range from 30% to 40%, preferably composition contains scattering particles 5 wt % or less based on the total amount of the composition, more preferably it is in the range from 4 to 0 wt %, even more preferably no scattering particles are in the composition, preferably is configured to show a haze value of 15% or less in the liquid state, preferably said haze value is in the range from 15 to 0.01%, more preferably said haze value is in the range from 10 to 0.1%, even more preferably said haze value is in the range from 5 to 0.1%.

In another aspect, the present invention also relates to a photo-reactive composition comprising at least one light emitting moiety, is configured to show a haze value of 15% or less in the liquid state, preferably said haze value is in the range from 15 to 0.01%, more preferably said haze value is in the range from 10 to 0.1%, even more preferably said haze value is in the range from 5 to 0.1%, and is configured to show a haze value of more than 15 in the cured state, more preferably it is in the range from 16% to 99%, even more preferably it is in the range from 20% to 99%, furthermore preferably it is in the range from 20% to 90%, particularly preferably it is in the range from 30% to 85% preferably composition optionally contains scattering particles 5 wt % or less based on the total amount of the composition, more preferably it is in the range from 4 to 0 wt %, even more preferably no scattering particles are in the composition.

In another aspect, the present invention also relates to a photo-reactive composition comprising at least one light emitting moiety, is configured to show the ratio of the haze value in cured state/the haze value in liquid state is more than 1, preferably in the range from 1.1 to 100, more preferably in the range from 2 to 50, even more preferably in the range from 5 to 50 preferably composition optionally contains scattering particles 5 wt % or less based on the total amount of the composition, more preferably it is in the range from 4 to 0 wt %, even more preferably no scattering particles are in the composition.

In another aspect, the present invention relates to a layer obtained or obtainable from the composition of the present invention by curing it, preferably said curing is a heat curing and/or photo irradiation curing, preferably said layer being a patterned layer.

In another aspect, the present invention relates to a layer obtained or obtainable from the composition of the present invention by curing it, containing at least a matrix material, one light emitting moiety, configured to show a haze value of more than 15%, more preferably it is in the range from 16% to 99%, even more preferably it is in the range from 20% to 99%, furthermore preferably it is in the range from 20% to 90%, particularly preferably it is in the range from 30% to 85%, preferably it has the EQE value 20% or more, more preferably said EQE value is in the range from 20% to 99%, more preferably said EQE value is in the range from 30% to 50%, even more preferably said EQE value is in the range from 30% to 40%, preferably said layer being a patterned layer.

In another aspect, the present invention relates to a layer containing at least a matrix material, one light emitting moiety and a plurality of voids, configured to show a haze value of more than 15%, more preferably it is in the range from 16% to 99%, even more preferably it is in the range from 20% to 99%, furthermore preferably it is in the range from 20% to 90%, particularly preferably it is in the range from 30% to 85%, preferably it has the EQE value 20% or more, more preferably said EQE value is in the range from 20% to 99%, more preferably said EQE value is in the range from 30% to 50%, even more preferably said EQE value is in the range from 30% to 40%, preferably said void is filled with a gas selected from air or an inert gas, preferably said inert gas is selected from one or more members of the group consisting of $N^2$, Ar, Ne, CO2, He, Kr, Xe, more preferably said void is filled with air or an inert gas of $N_2$, Ar or $CO_2$, preferably said layer being a patterned layer.

In another aspect, the present invention relates to a layer containing at least a matrix material, and a plurality of light emitting moieties, wherein said layer is configured to show a haze value of more than 15%, more preferably it is in the range from 16% to 99%, even more preferably it is in the range from 20% to 99%, furthermore preferably it is in the range from 20% to 90%, particularly preferably it is in the range from 30% to 85%, resulting from non-uniform distribution of the light emitting moieties in the layer, preferably said layer being a patterned layer.

In another aspect, the present invention relates to a layer containing at least one light emitting moiety, a matrix material and scattering particles, wherein the total amount of the scattering particles is 4 wt % or less based on the total amount of the solid contents of the layer, preferably it is in the range from 4 to 0 wt %, more preferably it is in the range from 1 to 0 wt %, more preferably the layer does not contain any scattering particles, is configured to achieve the EQE value 20% or more, more preferably said EQE value is in the range from 20% to 99%, more preferably said EQE value is in the range from 30% to 50%, even more preferably said EQE value is in the range from 30% to 40%, for blue-to-green conversion efficiency, preferably the layer is a patterned layer, preferably said layer being a patterned layer.

In another aspect, the present invention relates to a layer containing at least a matrix material and a plurality of light emitting moieties, that contains a $1^{st}$ phase and a $2^{nd}$ phase, wherein said $1^{st}$ phase and said $2^{nd}$ phase are different of each other, and said $1^{st}$ phase has a plurality of aggregates of said light emitting moieties and higher concentration per unit volume in the light emitting moieties than the $2^{nd}$ phase, preferably said unit volume is 1 $cm^3$.

In another aspect, the present invention relates to a process of fabricating the layer of the present invention, wherein the process comprises at least the following steps;

I) providing a composition of the present invention onto a substrate, preferably II) curing the composition, preferably said curing is performed by photo irradiation and/or thermal treatment.

In another aspect, the present invention relates to a layer obtained or obtainable from the process.

In another aspect, the present invention further relates to a color conversion device (100) comprising at least a $1^{st}$ pixel (161) partly or fully filled with the layer of the present invention, comprising at least a matrix material (120) containing a light emitting moiety (110), and a bank (150)

comprising at least a polymer material, preferably the color conversion device (100) further contains a supporting medium (170).

In another aspect, the present invention further relates to use of the composition of the present invention for fabricating the layer of the present invention or the device (100) of the present invention.

In another aspect, the present invention relates to a method for fabricating a color conversion device (100) of the present invention containing at least the following steps, preferably in this sequence;

Xi) Providing a bank composition onto a surface of a supporting medium

Xii) Curing the bank composition,

Xiii) Applying photo-patterning to the cured said composition to fabricate bank and a patterned pixel region, Xiv) Providing the composition of any one of claims 1 to 16 to at least one pixel region, preferably by ink-jetting, Xv) Curing the composition, preferably said color conversion device (100) further contains a supporting medium (170).

In another aspect, the present invention further relates to a color conversion device (100) obtainable or obtained from the method of the present invention.

In another aspect, the present invention also relates to use of the color conversion device (100) of the present invention in an optical device (300) containing at least one functional medium (320, 420, 520) configured to modulate a light or configured to emit light.

In another aspect, the present invention furthermore relates to an optical device (300) containing at least one functional medium (320, 420, 520) configured to modulate a light or configured to emit light, and the color conversion device (100) of the present invention.

Further advantages of the present invention will become evident from the following detailed description.

LIST OF REFERENCE SIGNS IN FIG. 1

Figure 1:
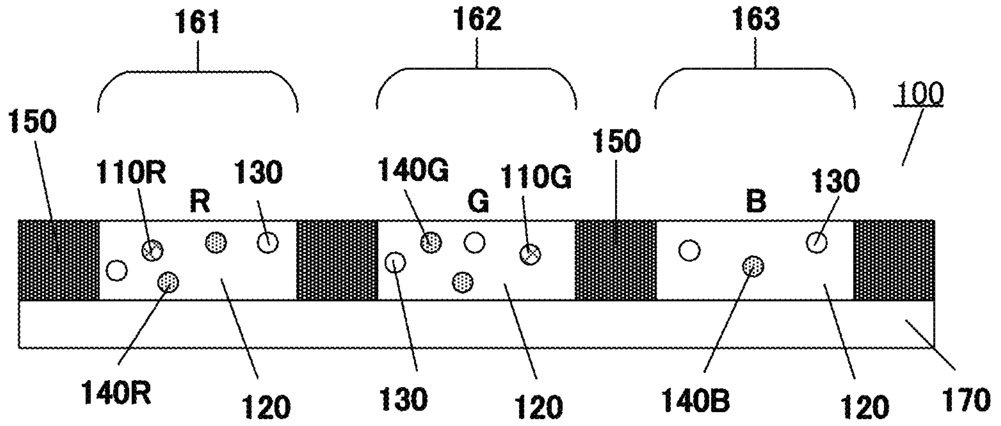
FIG. 1: shows a cross sectional view of a schematic of one embodiment of a color conversion film (100).
Figure 2:
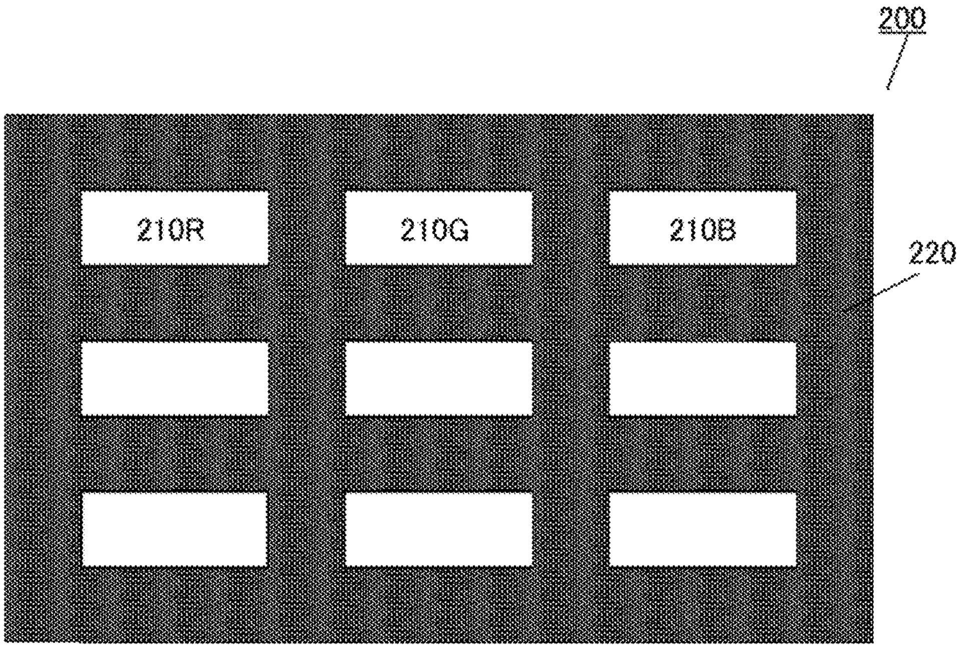
FIG. 2: shows a top view of a schematic of another embodiment of a color conversion film (100) of the invention.
Figure 3:
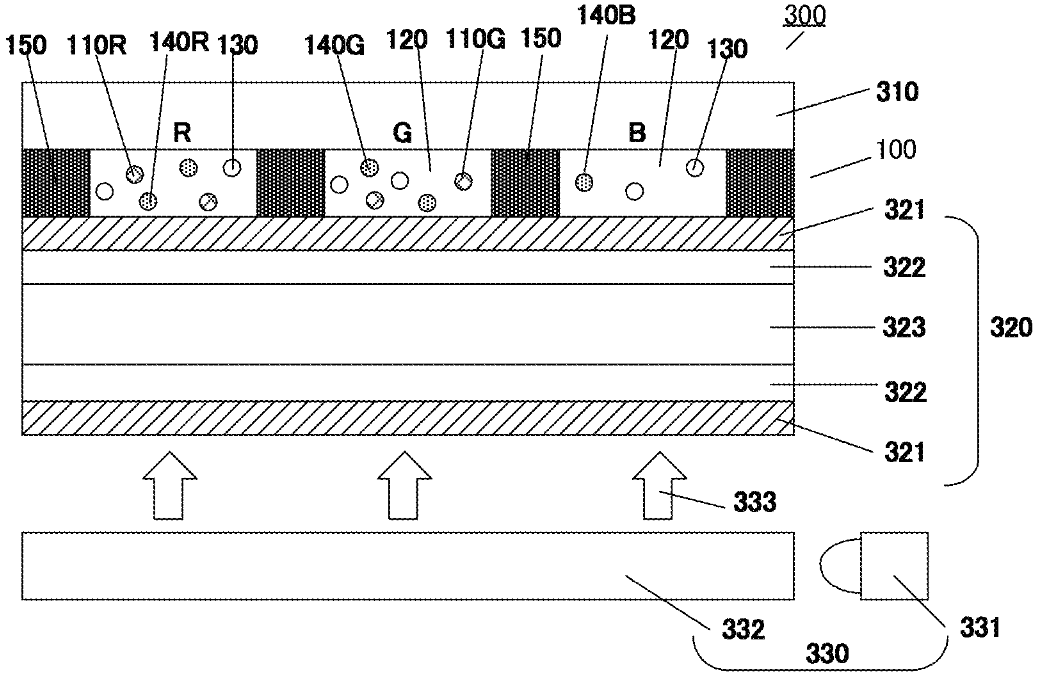
FIG. 3: shows a cross sectional view of a schematic of one embodiment of an optical device (300) of the invention.

100. a color conversion device
110. a light emitting moiety
110R. a light emitting moiety (red)
110G. a light emitting moiety (green)
120. a matrix material
130. a light scattering particle (optional)
140. a coloring agent (optional)
140R. a coloring agent (red) (optional)
140G. a coloring agent (green) (optional)
140B. a coloring agent (blue) (optional)
150. a bank
161. a $1^{st}$ pixel
162. a $2^{nd}$ pixel
163. a $3^{rd}$ pixel
170. a supporting medium (a substrate) (optional)

LIST OF REFERENCE SIGNS IN FIG. 2

200. a color conversion film
210R. a pixel (red)
210G. a pixel (green)
210B. a pixel (blue)
220. a bank

LIST OF REFERENCE SIGNS IN FIG. 3

300. an optical device
100. a color conversion device
110. a light emitting moiety
110R. a light emitting moiety (red)
110G. a light emitting moiety (green)
120. a matrix material
130. a light scattering particle (optional)
140. a coloring agent (optional)
140R. a coloring agent (red) (optional)
140G. a coloring agent (green) (optional)
140B. a coloring agent (blue) (optional)
150. a bank
320. a light modulator
321. a polarizer
322. an electrode
323. a liquid crystal layer
330. a light source
331. a LED light source
332. a light guiding plate (optional)
333. light emission from the light source (330)

LIST OF REFERENCE SIGNS IN FIG. 4

400. an optical device
100. a color conversion device
110. a light emitting moiety
110R. a light emitting moiety (red)
110G. a light emitting moiety (green)
120. a matrix material
130. a light scattering particle (optional)
140. a coloring agent (optional)
140R. a coloring agent (red) (optional)
140G. a coloring agent (green) (optional)
140B. a coloring agent (blue) (optional)
150. a bank
420. a light modulator

421. a polarizer
422. an electrode
423. a liquid crystal layer
430. a light source
431. a LED light source
432. a light guiding plate (optional)
440. a color filter
433. light emission from the light source (330)

LIST OF REFERENCE SIGNS IN FIG. 5

500. an optical device
100. a color conversion device
110. a light emitting moiety
110R. a light emitting moiety (red)
110G. a light emitting moiety (green)
120. a matrix material
130. a light scattering particle (optional)
140. a coloring agent (optional)
140R. a coloring agent (red) (optional)
140G. a coloring agent (green) (optional)
140B. a coloring agent (blue) (optional)
150. a bank
520. a light emitting device (e.g. OLED)
521. a TFT
522. an electrode (anode)
523. a substrate
524. an electrode (cathode)
525. light emitting layer (e.g. OLED layer(s))
526. light emission from a light emitting device (520)
530. an optical layer (e.g. polarizer) (optional)
540. a color filter

DETAILED DESCRIPTION OF THE INVENTION

In the present specification, symbols, units, abbreviations, and terms have the following meanings unless otherwise specified.

In the present specification, unless otherwise specifically mentioned, the singular form includes the plural form and "one" or "that" means "at least one". In the present specification, unless otherwise specifically mentioned, an element of a concept can be expressed by a plurality of species, and when the amount (for example, mass % or mol %) is described, it means sum of the plurality of species. "And/or" includes a combination of all elements and also includes single use of the element.

In the present specification, when a numerical range is indicated using "to" or "-", it includes both endpoints and units thereof are common. For example, 5 to 25 mol % means 5 mol % or more and 25 mol % or less.

In the present specification, the hydrocarbon means one including carbon and hydrogen, and optionally including oxygen or nitrogen. The hydrocarbyl group means a monovalent or divalent or higher valent hydrocarbon. In the present specification, the aliphatic hydrocarbon means a linear, branched or cyclic aliphatic hydrocarbon, and the aliphatic hydrocarbon group means a monovalent or divalent or higher valent aliphatic hydrocarbon. The aromatic hydrocarbon means a hydrocarbon comprising an aromatic ring which may optionally not only comprise an aliphatic hydrocarbon group as a substituent but also be condensed with an alicycle. The aromatic hydrocarbon group means a monovalent or divalent or higher valent aromatic hydrocarbon. Further, the aromatic ring means a hydrocarbon comprising a conjugated unsaturated ring structure, and the alicycle means a hydrocarbon having a ring structure but comprising no conjugated unsaturated ring structure.

In the present specification, the alkyl means a group obtained by removing any one hydrogen from a linear or branched, saturated hydrocarbon and includes a linear alkyl and branched alkyl, and the cycloalkyl means a group obtained by removing one hydrogen from a saturated hydrocarbon comprising a cyclic structure and optionally includes a linear or branched alkyl in the cyclic structure as a side chain.

In the present specification, the aryl means a group obtained by removing any one hydrogen from an aromatic hydrocarbon. The alkylene means a group obtained by removing any two hydrogens from a linear or branched, saturated hydrocarbon. The arylene means a hydrocarbon group obtained by removing any two hydrogens from an aromatic hydrocarbon.

In the present specification, the descriptions such as "$C_{x-y}$", "$C_x$-$C_y$" and "$C_x$" mean the number of carbons in the molecule or substituent group. For example, $C_{1-6}$ alkyl means alkyl having 1 to 6 carbons (such as methyl, ethyl, propyl, butyl, pentyl and hexyl). Further, the fluoroalkyl as used in the present specification refers to one in which one or more hydrogen in alkyl is replaced with fluorine, and the fluoroaryl is one in which one or more hydrogen in aryl are replaced with fluorine.

In the present specification, when polymer has a plural types of repeating units, these repeating units copolymerize. These copolymerization are any of alternating copolymerization, random copolymerization, block copolymerization, graft copolymerization, or a mixture of any of these.

In the present specification, "%" represents mass % and "ratio" represents ratio by mass.

In the present specification, Celsius is used as the temperature unit. For example, 20 degrees means 20 degrees Celsius.

Preferable Embodiments

According to the present invention, in one aspect, photoreactive composition comprising at least one light emitting moiety, is configured to show a haze value of 15% or less in the liquid state, preferably said haze value is in the range from 15 to 0.01%, more preferably said haze value is in the range from 10 to 0.1%, even more preferably said haze value is in the range from 5 to 0.1%, and is configured to show the EQE value 20% or more in the cured state, preferably said EQE value is in the range from 20% to 99%, more preferably said EQE value is in the range from 30% to 50%, even more preferably said EQE value is in the range from 30% to 40%, preferably the composition contains scattering particles 5 wt % or less based on the total amount of the composition, more preferably it is in the range from 4 to 0 wt %, even more preferably no scattering particles are in the composition, preferably the composition contains solid particles 5 wt % or less based on the total amount of the composition, wherein said sold particle is not the light emitting moiety, more preferably it is in the range from 4 to 0 wt %, even more preferably no sold particles other than the light emitting moiety are in the composition, preferably it is configured to show a haze value of more than 15% in the cured state, more preferably it is in the range from 16% to 99%, even more preferably it is in the range from 20% to 99%, furthermore preferably it is in the range from 20% to 90%, particularly preferably it is in the range from 30% to 85%.

In another aspect of the present invention, a photoreactive composition comprising at least one light emitting moiety, is configured to show a haze value of more than 15% in the cured state, more preferably it is in the range from 16% to 99%, even more preferably it is in the range from 20% to 99%, furthermore preferably it is in the range from 20% to 90%, particularly preferably it is in the range from 30% to 85% and is configured to show the EQE value 20% or more, preferably said EQE value is in the range from 20% to 99%, more preferably said EQE value is in the range from 30% to 50%, even more preferably said EQE value is in the range from 30% to 40%, preferably composition contains scattering particles 5 wt % or less based on the total amount of the composition, more preferably it is in the range from 4 to 0 wt %, even more preferably no scattering particles are in the composition, preferably is configured to show a haze value of 15% or less in the liquid state, preferably said haze value is in the range from 15 to more preferably said haze value is in the range from 10 to 0.1%, even more preferably said haze value is in the range from 5 to 0.1%.

In another aspect of the present invention, a photo-reactive composition comprising at least one light emitting moiety, is configured to show a haze value of 15% or less in the liquid state, preferably said haze value is in the range from 15 to 0.01%, more preferably said haze value is in the range from 10 to 0.1%, even more preferably said haze value is in the range from to 0.1%, and is configured to show a haze value of more than 15 in the cured state, more preferably it is in the range from 16% to 99%, even more preferably it is in the range from 20% to 99%, furthermore preferably it is in the range from 20% to 90%, particularly preferably it is in the range from 30% to 85% preferably composition optionally contains scattering particles or less based on the total amount of the composition, more preferably it is in the range from 4 to 0 wt %, even more preferably no scattering particles are in the composition.

In another aspect of the present invention, a photo-reactive composition comprising at least one light emitting moiety, is configured to show the ratio of the haze value in cured state/the haze value in liquid state is more than 1, preferably in the range from 1.1 to 100, more preferably in the range from 2 to 50, even more preferably in the range from 5 to 50 preferably composition optionally contains scattering particles 5 wt % or less based on the total amount of the composition, more preferably it is in the range from 4 to 0 wt %, even more preferably no scattering particles are in the composition.

According to the present invention, said Haze value is measured at room temperature in air using a photo spectrometer (Perkin Elmer, Lambda 1050) fitted with an integration sphere detector, and a test cell containing the composition as a 15 μm thick layer (in liquid state or in cured solid state) sandwiched between two 0.7 mm thick alkali-free AF glasses, whereas said test cell is or is not fitted in the beam path in front of the integration sphere, to perform the measurement sequence consisting of the following steps T1 to T4 in the wavelength range of 380-780 nm:

(T1) all the light emitted from the light source of the photo spectrometer is collected by the integration sphere which is closed with a white reflector to measure all light emitted by the photo spectrometer, whereas for this step said test cell is not in the beam path in front of the integration sphere;

(T2) the incident light first passes through the sample before being collected in the closed integration sphere to measure all the light passing through the sample, whereas for this step said test cell is placed in the beam path in front of the integration sphere;

(T3) the incident light is allowed to pass through the open integration sphere to determine the fraction of scattered light, whereas for this step said test cell is not in the beam path of the integration sphere;

(T4) light passes first through the sample and is then collected by the opened integration sphere to determine the amount of light scattered by the sample, whereas for this step said test cell is placed in the beam path in front of the integration sphere;

then, said haze value is calculated using the following equation:

$$\text{Haze value}=((T4/T2)-(T3/T1))*100[\%]$$, whereas $T1$–$T4$ are measured over the wavelength range 380–780 nm.

According to the present invention, said EQE is measured by the following EQE measurement process at room temperature which is based on using an integrating sphere, equipped with a 450 nm excitation light source coupled in via an optical fiber, and a spectrometer (C9920, Hamamatsu photonics), and which consists of a first measurement using air as the reference to detect the incident photons of the excitation light and a second measurement with the sample or test cell placed in front of the integrating sphere in between the opening of the integrating sphere and the exit of the optical fiber to detect the photons incident from the excitation light source transmitted through the sample and the photos emitted from the sample or test cell, whereas for both cases photons exiting the integrating sphere are counted by the spectrometer and EQE and BL calculation is done with the following equations and the number of photons of the excitation light and emission light is calculated by integration over the following wavelength ranges;

*EQE*=Photons [Emission light]/Photons [Excitation light measured without sample in place];

*BL*=Photons [measured without sample in place]/Photons [Excitation light measured without sample in place];

Emission light if green light emitting moieties are used: 480 nm-600 nm,

Emission light if red light emitting moieties are used: 560 nm-680 nm

Excitation light: 430 nm-470 nm.

In a preferred embodiment of the present invention, the composition contains a plurality of light emitting moieties, preferably the total amount of the light emitting moieties is in the range from 0.1 wt. % to 90 wt. % based on the total amount of the composition, more preferably from 10 wt. % to 70 wt. %, even more preferably from 30 wt. % to 50 wt. %.

In a preferred embodiment of the present invention, the composition further comprises at least a (meth)acrylate monomer, preferably said monomer is a di-(meth)acrylate monomer, more preferably it is a di-methacrylate monomer or a di-acrylate monomer, even more preferably it is represented by following chemical formula (I), (I)

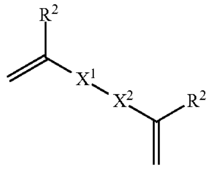

wherein $X^1$ is a non-substituted or substituted alkyl group, aryl group or an alkoxy group or an ester group;

$X^2$ is a non-substituted or substituted alkyl group, aryl group or an alkoxy group or an ester group;

$R^1$ is a hydrogen atom, halogen atom of Cl, Br, or F, methyl group, alkyl group, aryl group, alkoxy group, ester group, or a carboxylic acid group;

$R^2$ is a hydrogen atom, halogen atom of Cl, Br, or F, methyl group, alkyl group, aryl group, alkoxy group, ester group, or a carboxylic acid group;

preferably the symbol $X^1$ is

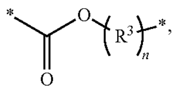

where "*" on the left side of the formula represents the connecting point to the carbon atom of the end group $C{=}CR^1$ of the formula (I) and "*" on the right side represents the connecting point to symbol $X^2$ of the formula (I);

n is 0 or 1;

preferably the symbol $X^2$ is

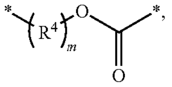

where "*" on the left side of the formula represents the connecting point to symbol X1 of the formula (I) and "*" on the right side represents the connecting point to the end group $C{=}CR^2$ of the formula (I);

m is 0 or 1;

preferably at least m or n is 1;

$R^3$ is a straight alkylene chain or alkoxylene chain having 1 to 25 carbon atoms, a cycloalkane having 3 to 25 carbon atoms or an aryl group having 3 to 25 carbon atoms, preferably $R^3$ is a straight alkylene chain or alkoxylene chain having 1 to 15 carbon atoms, more preferably 1 to 5 carbon atoms, which may be substituted by one or more radicals $R^a$, where one or more non-adjacent $CH_2$ groups may be replaced by $R^aC{=}CR^a$, $C{\equiv}C$, $Si(R^a)_2$, $Ge(R^a)_2$, $Sn(R^a)_2$, $C{=}O$, $C{=}S$, $C{=}Se$, $C{=}NR^a$, $P({=}O)(R^a)$, SO, SO2, $NR^a$, OS, or $CONR^a$ and where one or more H atoms may be replaced by D, F, Cl, Br, I, CN or $NO_2$;

$R^4$ is a straight alkylene chain or alkoxylene chain having 1 to 25 carbon atoms, a cycloalkane having 3 to 25 carbon atoms or an aryl group having 3 to 25 carbon atoms, preferably $R^4$ is a straight alkylene chain or alkoxylene chain having 1 to 15 carbon atoms, more preferably 1 to 5 carbon atoms, which may be substituted by one or more radicals $R^a$, where one or more non-adjacent $CH_2$ groups may be replaced by $R^aC{=}CR^a$, $C{\equiv}C$, $Si(R^a)_2$, $Ge(R^a)_2$, $Sn(R^a)_2$, $C{=}O$, $C{=}S$, $C{=}Se$, $C{=}NR^a$, $P({=}O)(R^a)$, SO, SO2, $NR^a$, OS, or $CONR^a$ and where one or more H atoms may be replaced by D, F, Cl, Br, I, CN or $NO_2$;

$R^a$ is at each occurrence, identically or differently, H, D or an alkyl group having 1 to 20 carbon atoms, cyclic alkyl or alkoxy group having 3 to 40 carbon atoms, an aromatic ring system having 5 to 60 carbon ring atoms, or a hetero aromatic ring system having 5 to 60 carbon atoms, wherein H atoms may be replaced by D, F, Cl, Br, I; two or more adjacent substituents $R^a$ here may also form a mono- or polycyclic, aliphatic, aromatic or heteroaromatic ring system with one another.

In a preferred embodiment of the present invention, the composition further comprises an another (meth)acrylate monomer which is different from the (meth)acrylate monomer of chemical formula (I), preferably said another (meth) acrylate monomer is a mono-(meth)acrylate monomer, more preferably it is a mono-methacrylate monomer or mono-acrylate monomer, even more preferably it is represented by following chemical formula (II), (II)

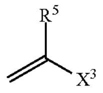

$X^3$ is a non-substituted or substituted alkyl group, aryl group or an alkoxy group;

preferably the symbol $X^3$ is

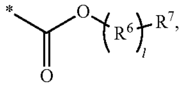

where "*" on the left side of the formula represents the connecting point to the end group $C{=}CR^5$ of the formula (I);

I is 0 or 1;

$R^5$ is a hydrogen atom, halogen atom of Cl, Br, or F, methyl group, alkyl group, aryl group, alkoxy group, ester group, or a carboxylic acid group; $R^6$ is a straight alkylene chain or alkoxylene chain having 1 to 25 carbon atoms, preferably $R^6$ is a straight alkylene chain or alkoxylene chain having 1 to 15 carbon atoms, more preferably 1 to 5 carbon atoms, which may be substituted by one or more radicals $R^a$, where one or more non-adjacent $CH_2$ groups may be replaced by $R^aC{=}CR^a$, $C{=}C$, $Si(R^a)_2$, $Ge(R^a)_2$, $Sn(R^a)_2$, $C{=}O$, $C{=}S$, $C{=}Se$, $C{=}NR^a$, $P({=}O)(R^a)$, SO, SO2, $NR^a$, OS, or $CONR^a$ and where one or more H atoms may be replaced by D, F, Cl, Br, I, CN or $NO_2$;

$R^7$ is a straight alkylene chain or alkoxylene chain having 1 to 25 carbon atoms, preferably $R^7$ is a straight alkylene chain or alkoxylene chain having 1 to 15 carbon atoms, more preferably 1 to 5 carbon atoms, which may be substituted by one or more radicals $R^a$, where one or more non-adjacent $CH_2$ groups may be replaced by $R^aC{=}CR^a$, CC, $Si(R^a)_2$, $Ge(R^a)_2$, $Sn(R^a)_2$, $C{=}O$, $C{=}S$, $C{=}Se$, $C{=}NR^a$, $P({=}O)(R^a)$, SO, SO2, $NR^a$, OS, or $CONR^a$ and where one or more H atoms may be replaced by D, F, Cl, Br, I, CN or $NO_2$;

$R^a$ is at each occurrence, identically or differently, H, D or an alkyl group having 1 to 20 carbon atoms, cyclic alkyl or alkoxy group having 3 to 40 carbon atoms, an aromatic ring system having 5 to 60 carbon ring atoms, or a hetero aromatic ring system having 5 to 60 carbon atoms, wherein H atoms may be replaced by D, F, Cl, Br, I; two or more adjacent substituents $R^a$ here may also form a mono- or polycyclic, aliphatic, aromatic or heteroaromatic ring system with one another.

In a preferred embodiment of the present invention, the (meth)acrylate monomer of chemical formula (II) is in the composition and the mixing ratio of the (meth)acrylate monomer of chemical formula (I) to the (meth)acrylate monomer of chemical formula (II) is in the range from 1:99 to 99:1 (formula (I):formula (II)), preferably from 5:95 to 50:50, more preferably from 10:90 to 40:60, even more preferably it is from 15:85 to 35:65, preferably at least a purified (meth)acrylate monomer represented by chemical formula (I), (II) is used in the composition, more preferably the (meth)acrylate monomer of chemical formula (I) and the (meth)acrylate monomer of chemical formula (II) are both obtained or obtainable by a purification method.

In a preferred embodiment of the present invention, the boiling point (B.P.) of said (meth)acrylate monomer of chemical formula (I) and/or chemical formula (II) is 250° C. or more, preferably the (meth)acrylate monomers of chemical formula (I) and chemical formula (II) are both 250° C. or more, more preferably it is in the range from 250° C. to 350° C., even more preferably from 280° C. to 350° C., further more preferably from 300° C. to 348° C.

12. In a preferred embodiment of the present invention, the viscosity of the composition is 35 cP or less at room temperature, preferably in the range from 1 to 35 cP, more preferably from 2 to 30 cP, even more preferably from 2 to 25 cP.

In a preferred embodiment of the present invention, said light emitting moiety comprises a ligand, more preferably said light emitting moiety comprises an alkyl type ligand having carbon atoms 2 to 25.

In a preferred embodiment of the present invention, said light emitting moiety is an organic light emitting material and/or an inorganic light emitting material, preferably said organic light emitting materials is an organic dye, or an organic light emitting material for organic light emitting diode device, preferably said inorganic light emitting material is an inorganic phosphor and/or a quantum material.

In some embodiments of the present invention, the composition further comprises an additional material selected from one or more members of the group consisting of;

A) another light emitting moiety which is different from the light emitting moiety of claim 1, preferably said light emitting moiety is an organic light emitting material and/or an inorganic light emitting material, more preferably said organic light emitting materials is an organic dye, or an organic light emitting material for organic light emitting diode device, more preferably said inorganic light emitting material is an inorganic phosphor and/or a quantum material, preferably said light emitting moiety comprises a ligand, more preferably said light emitting moiety comprises an alkyl type ligand having carbon atoms 2 to 25;

B) another (meth)acrylate monomer; and

C) optically transparent polymers, anti-oxidants, radical quenchers, photo initiators and/or surfactants.

In a preferred embodiment of the present invention, the composition comprises a solvent 10 wt % or less based on the total amount of the composition, more preferably it is 5 wt % or less, more preferably it is a solvent free composition, preferably the composition does not comprise any one of the following solvent selected from one or more members of the group consisting of ethylene glycol monoalkyl ethers, such as, ethylene glycol monomethyl ether, ethylene glycol monoethyl ether, ethylene glycol monopropyl ether, and ethylene glycol monobutyl ether; diethylene glycol dialkyl ethers, such as, diethylene glycol dimethyl ether, diethylene glycol diethyl ether, diethylene glycol dipropyl ether, and diethylene glycol dibutyl ether; propylene glycol monoalkyl ethers, such as, propylene glycol monomethyl ether (PGME), propylene glycol monoethyl ether, and propylene glycol monopropyl ether; ethylene glycol alkyl ether acetates, such as, methyl cellosolve acetate and ethyl cellosolve acetate; propylene glycol alkyl ether acetates, such as, propylene glycol monomethyl ether acetate (PGMEA), propylene glycol monoethyl ether acetate, and propylene glycol monopropyl ether acetate; ketones, such as, methyl ethyl ketone, acetone, methyl amyl ketone, methyl isobutyl ketone, and cyclohexanone; alcohols, such as, ethanol, propanol, butanol, hexanol, cyclo hexanol, ethylene glycol, triethylene glycol and glycerin; esters, such as, ethyl 3-ethoxypropionate, methyl 3-methoxypropionate and ethyl lactate; and cyclic asters, such as, gamma-butyro-lactone; chlorinated hydrocarbons, such as chloroform, dichloromethane, chlorobenzene, trimethyl benzenes such as 1,3,5-trimethylbenzene, 1,2,4-trimethyl benzene, 1,2,3-trimethyl benzene, docecylbenzene, cyclohexylbenzene, 1,2,3,4-tetramethylbenzene, 1,2,3,5-tetramethylbenzene, 3-isopropylbiphenyl, 3-methylbiphenyl, 4-methylbiphenyl and dichlorobenzene, preferably said solvent is propylene glycol alkyl ether acetates, alkyl acetates, ethylene glycol monoalkyl ethers, propylene glycol, and propylene glycol monoalkyl ethers.

In another aspect, the present invention relates to a layer obtained or obtainable from the composition of the present invention by curing it, preferably said curing is a heat curing and/or photo irradiation curing, preferably said layer being a patterned layer.

In another aspect, the present invention relates to a layer obtained or obtainable from the composition of the present invention by curing it, containing at least a matrix material, one light emitting moiety, configured to show a haze value of more than 15%, more preferably it is in the range from 16% to 99%, even more preferably it is in the range from 20% to 99%, furthermore preferably it is in the range from 20% to 90%, particularly preferably it is in the range from 30% to 85%, preferably it has the EQE value 20% or more, more preferably said EQE value is in the range from 20% to 99%, more preferably said EQE value is in the range from 30% to 50%, even more preferably said EQE value is in the range from 30% to 40%, preferably said layer being a patterned layer.

In another aspect, the present invention relates to a layer containing at least a matrix material, one light emitting moiety and a plurality of voids, configured to show a haze value of more than 15%, more preferably it is in the range from 16% to 99%, even more preferably it is in the range from 20% to 99%, furthermore preferably it is in the range from 20% to 90%, particularly preferably it is in the range from 30% to 85%, preferably it has the EQE value 20% or more, more preferably said EQE value is in the range from 20% to 99%, more preferably said EQE value is in the range from 30% to 50%, even more preferably said EQE value is in the range from 30% to 40%, preferably said void is filled with a gas selected from air or an inert gas, preferably said inert gas is selected from one or more members of the group consisting of $N^2$, Ar, Ne, CO2, He, Kr, Xe, more preferably said void is filled with air or an inert gas of $N_2$, Ar or $CO_2$, preferably said layer being a patterned layer.

In another aspect, the present invention relates to a layer containing at least a matrix material, and a plurality of light emitting moieties, wherein said layer is configured to show a haze value of more than 15%, more preferably it is in the range from 16% to 99%, even more preferably it is in the range from 20% to 99%, furthermore preferably it is in the range from 20% to 90%, particularly preferably it is in the range from 30% to 85%, resulting from non-uniform distribution of the light emitting moieties in the layer, preferably said layer being a patterned layer.

In another aspect, the present invention relates to a layer containing at least one light emitting moiety, a matrix material and scattering particles, wherein the total amount of the scattering particles is 4 wt % or less based on the total amount of the solid contents of the layer, preferably it is in the range from 4 to 0 wt %, more preferably it is in the range from 1 to 0 wt %, more preferably the layer does not contain any scattering particles, is configured to achieve the EQE value 20% or more, more preferably said EQE value is in the range from 20% to 99%, more preferably said EQE value is in the range from 30% to 50%, even more preferably said EQE value is in the range from 30% to 40%, for blue-to-green conversion efficiency, preferably the layer is a patterned layer, preferably said layer being a patterned layer.

In another aspect, the present invention relates to a layer containing at least a matrix material and a plurality of light emitting moieties, contains a $1^{st}$ phase and a $2^{nd}$ phase, wherein said $1^{st}$ phase and said $2^{nd}$ phase are different of each other, and said $1^{st}$ phase has a plurality of aggregates of said light emitting moieties and higher concentration per unit volume in the light emitting moieties than the $2^{nd}$ phase, preferably said unit volume is 1 $cm^3$. Preferably said $1^{st}$ phase and said $2^{nd}$ phase are different of each other and said $1^{st}$ phase contains an aggregates of said light emitting moieties and said $2^{nd}$ phase is a carbon rich phase obtainable from the matrix material.

In some embodiments of the present invention, the layer thickness of the layer is in the range from 1 to 50 um, preferably 5 to 30, more preferably 8 to 20, further more preferably 10-15 um.

In some embodiments of the present invention, the layer contains a plurality of light emitting moieties, preferably the total amount of the light emitting moieties is in the range from 0.1 wt. % to 90 wt. % based on the total amount of the composition, more preferably from 10 wt. % to 70 wt. %, even more preferably from 30 wt. % to 50 wt. %.

In another aspect, the present invention relates to a process of fabricating the layer of the present invention, wherein the process comprises at least the following steps;

I) providing a composition of the present invention onto a substrate, preferably II) curing the composition, preferably said curing is performed by photo irradiation and/or thermal treatment.

In another aspect, the present invention relates to a layer obtained or obtainable from the process of the present invention.

In another aspect, the present invention also relates to a color conversion device (100) comprising at least a $1^{st}$ pixel (161) partly or fully filled with the layer of any one of embodiments 17 to 24 and 26 comprising at least a matrix material (120) containing a light emitting moiety (110), and a bank (150) comprising at least a polymer material, preferably the color conversion device (100) further contains a supporting medium (170).

$1^{st}$ Pixel (161)

According to the present invention, said $1^{st}$ pixel (161) comprises at least a matrix material (120) containing a light emitting moiety (110). In a preferable embodiment, the $1^{st}$ pixel (161) is a solid layer obtained or obtainable by curing the composition of the present invention containing at least one acrylate monomer together with at least one light emitting moiety (110), preferably said curing is a photo curing by photo irradiation, thermal curing or a combination of a photo curing and a thermal curing.

In some embodiments of the present invention, the layer thickness of the pixel (161) is in the range from 0.1 to 100 μm, preferably it is from 1 to 50 μm, more preferably from 5 to 25 μm.

In some embodiments of the present invention, the color conversion device (100) further contains a $2^{nd}$ pixel (162), preferably the device (100) contains at least said $1^{st}$ pixel (161), $2^{nd}$ pixel (162) and a $3^{rd}$ pixel (163), more preferably said $1^{st}$ pixel (161) is a red color pixel, the $2^{nd}$ pixel (162) is a green color pixel and the $3^{rd}$ pixel (163) is a blue color pixel, even more preferably the $1^{st}$ pixel (161) contains a red light emitting moiety (110R), the $2^{nd}$ color pixel (162) contains a green light emitting moiety (110G) and the $3^{rd}$ pixel (163) does not contain any light emitting moiety.

In some embodiments, at least one pixel (160) additionally comprises at least one light scattering particle (130) in the matrix material (120), preferably the pixel (160) contains a plurality of light scattering particles (130).

In some embodiments of the present invention, said $1^{st}$ pixel (161) consists of one pixel or two or more sub-pixels configured to emit red-color when irradiated by an excitation light, more preferably said sub-pixels contains the same light emitting moiety (110).

Matrix Material (120)

In a preferable embodiment, the matrix material (120) contains a (meth)acrylate polymer, preferably it is a methacrylate polymer, an acrylate polymer or a combination of thereof, more preferably it is an acrylate polymer, even more preferably said matrix material (120) is obtained or obtainable from the composition of the present invention containing at least one acrylate monomer, further more preferably said matrix material (120) is obtained or obtainable from the composition of the present invention containing at least one di-acrylate monomer, particularly preferably said matrix material (120) is obtained or obtainable from the composition of the present invention containing at least one di-acrylate monomer and a mono-acrylate monomer, preferably said composition is a photosensitive composition.

Light Emitting Moiety (110)

In a preferable embodiment of the present invention, said light emitting moiety (110) is an organic and/or inorganic light emitting material, preferably it is an organic dye, inorganic phosphor and/or a semiconducting light emitting nanoparticle such as a quantum material.

In some embodiments of the present invention, the total amount of the light emitting moiety (110) is in the range from 0.1 wt. % to 90 wt. % based on the total amount of the $1^{st}$ pixel (161), preferably from 10 wt. % to 70 wt. %, more preferably from 30 wt. % to 50 wt. %.

iii) Semiconducting Light Emitting Nanoparticle

According to the present invention, the term "semiconductor" means a material that has electrical conductivity to a degree between that of a conductor (such as copper) and that of an insulator (such as glass) at room temperature. Preferably, a semiconductor is a material whose electrical conductivity increases with the temperature.

The term "nanosized" means the size in between 0.1 nm to 150 nm, more preferably 3 nm to 50 nm.

Thus, according to the present invention, "semiconducting light emitting nanoparticle" is taken to mean that the light emitting material which size is in between 0.1 nm to 150 nm, more preferably 3 nm to 50 nm, having electrical conductivity to a degree between that of a conductor (such as copper) and that of an insulator (such as glass) at room temperature, preferably, a semiconductor is a material whose electrical conductivity increases with the temperature, and the size is in between 0.1 nm and 150 nm, preferably 0.5 nm to 150 nm, more preferably 1 nm to 50 nm.

According to the present invention, the term "size" means the average diameter of the longest axis of the semiconducting nanosized light emitting particles.

The average diameter of the semiconducting nanosized light emitting particles is calculated based on 100 semiconducting light emitting nanoparticles in a TEM image created by a Tecnai G2 Spirit Twin T-12 Transmission Electron Microscope.

In a preferred embodiment of the present invention, the semiconducting light emitting nanoparticle of the present invention is a quantum sized material.

According to the present invention, the term "quantum sized" means the size of the semiconducting material itself without ligands or another surface modification, which can show the quantum confinement effect, like described in, for example, ISBN:978-3-662-44822-9.

For example, CdS, CdSe, CdTe, ZnS, ZnSe, ZnSeS, ZnTe, ZnO, GaAs, GaP, GaSb, HgS, HgSe, HgSe, HgTe, InAs, InP, InPZn, InPZnS, InPZnSe, InPZnSeS, InPZnGa, InPGaS, InPGaSe, InPGaSeS, InPZnGaSeS and InPGa, InCdP, InPCdS, InPCdSe, InSb, AlAs, AlP, AlSb, $Cu_2S$, $Cu_2Se$, $CuInS_2$, $CuInSe_2$, $Cu_2(ZnSn)S_4$, $Cu_2(InGa)S_4$, $TiO_2$ alloys and a combination of any of these can be used.

In a preferred embodiment of the present invention, the $1^{st}$ semiconducting material comprises at least one element of the group 13 of the periodic table, and one element of the group 15 of the periodic table, preferably the element of the group 13 is In, and the element of the group 15 is P, more preferably the $1^{st}$ semiconducting material is selected from the group consisting of InP, InPZn, InPZnS, InPZnSe, InPZnSeS, InPZnGa, InPGaS, InPGaSe, InPGaSeS, InPZnGaSeS and InPGa.

According to the present invention, a type of shape of the core of the semiconducting light emitting nanoparticle, and shape of the semiconducting light emitting nanoparticle to be synthesized are not particularly limited.

For examples, spherical shaped, elongated shaped, star shaped, polyhedron shaped, pyramidal shaped, tetrapod shaped, tetrahedron shaped, platelet shaped, cone shaped, and irregular shaped core and—or a semiconducting light emitting nanoparticle can be synthesized.

In some embodiments of the present invention, the average diameter of the core is in the range from 1.5 nm to 3.5 nm.

The average diameter of the core is calculated based on 100 semiconducting light emitting nanoparticles in a TEM image created by a Tecnai G2 Spirit Twin T-12 Transmission Electron Microscope.

In some embodiments of the present invention, at least one the shell layer comprises or a consisting of a $1^{st}$ element of group 12 of the periodic table and a $2^{nd}$ element of group 16 of the periodic table, preferably, the $1^{st}$ element is Zn, and the $2^{nd}$ element is S, Se, or Te; preferably a first shell layer covering directly onto said core comprises or a consisting of a $1^{st}$ element of group 12 of the periodic table and a $2^{nd}$ element of group 16 of the periodic table, preferably, the $1^{st}$ element is Zn, and the $2^{nd}$ element is S, Se, or Te.

In a preferred embodiment of the present invention, at least one shell layer (a first shell layer) is represented by following formula (XI), preferably the shell layer directly covering the core is represented by the chemical formula (XI);

$$ZnS_xSe_yTe_z \quad (XI)$$

wherein $0 \le x \le 1$, $0 \le y \le 1$, $0 \le z \le 1$, and $x+y+z=1$, preferably $0 \le x \le 1$, $0 \le y \le 1$, $z=0$, and $x+y=1$, preferably, the shell layer is ZnSe, $ZnS_xSe_y$, $ZnSe_yTe_z$ or $ZnS_xTe_z$.

In some embodiments of the present invention, said shell layer is an alloyed shell layer or a graded shell layer, preferably said graded shell layer is $ZnS_xSe_y$, $ZnSe_yTe_z$, or $ZnS_xTe_z$, more preferably it is $ZnS_xSe_y$.

In some embodiments of the present invention, the semiconducting light emitting nanoparticle further comprises $2^{nd}$ shell layer onto said shell layer, preferably the $2^{nd}$ shell layer comprises or a consisting of a $3^{rd}$ element of group 12 of the periodic table and a $4^{th}$ element of group 16 of the periodic table, more preferably the $3^{rd}$ element is Zn, and the $4^{th}$ element is S, Se, or Te with the proviso that the $4^{th}$ element and the $2^{nd}$ element are not same.

In a preferred embodiment of the present invention, the $2^{nd}$ shell layer is represented by following formula (XI'), $$ZnS_xSe_yTe_z \quad (XI')$$

wherein $0 \le x \le 1$, $0 \le y \le 1$, $0 \le z \le 1$, and $x+y+z=1$, preferably, the shell layer is ZnSe, $ZnS_xSe_y$, $ZnSe_yTe_z$, or $ZnS_xTe_z$ with the proviso that the shell layer and the $2^{nd}$ shell layer is not the same.

In some embodiments of the present invention, said $2^{nd}$ shell layer can be an alloyed shell layer.

In some embodiments of the present invention, the semiconducting light emitting nanoparticle can further comprise one or more additional shell layers onto the $2^{nd}$ shell layer as a multishell.

According to the present invention, the term "multishell" stands for the stacked shell layers consisting of three or more shell layers.

For example, CdSe/CdS, CdSeS/CdZnS, CdSeS/CdS/ZnS, ZnSe/CdS, CdSe/ZnS, InP/ZnS, InP/ZnSe, InP/ZnSe/ZnS, InZnP/ZnS, InZnP/ZnSe, InZnP/ZnSe/ZnS, InGaP/ZnS, InGaP/ZnSe, InGaP/ZnSe/ZnS, InZnPS/ZnS, InZnPS ZnSe, InZnPS/ZnSe/ZnS, ZnSe/CdS, ZnSe/ZnS or combination of any of these, can be used. Preferably, InP/ZnS, InP/ZnSe, InP/ZnSe/ZnS, InZnP/ZnS, InZnP/ZnSe, InZnP/ZnSe/ZnS, InGaP/ZnS, InGaP/ZnSe, InGaP/ZnSe/ZnS.

Such semiconducting light emitting nanoparticles are publicly available (for example from Sigma Aldrich) and/or can be synthesized with the method described for example in U.S. Pat. Nos. 7,588,828 B, 8,679,543 B and Chem. Mater. 2015, 27, pp 4893-4898.

In some embodiments of the present invention, the composition comprises two or more semiconducting light emitting nanoparticles.

In some embodiments of the present invention, the composition comprises a plurality of semiconducting light emitting nanoparticles.

In some embodiments of the present invention, the total amount of the semiconducting light emitting nanoparticles is in the range from 0.1 wt. % to 90 wt. % based on the total amount of the composition, preferably from 10 wt. % to 70 wt. %, more preferably from 30 wt. % to 50 wt. %.

Bank (150)

In some embodiments of the present invention, the height of the bank (150) is in the range from 0.1 to 100 μm, preferably it is from 1 to 50 μm, more preferably from 1 to 25 μm, furthermore preferably from 5 to 20 μm.

In a preferred embodiment of the present invention, the bank (150) is configured to determine the area of said $1^{st}$ pixel (161) and at least a part of the bank (150) is directly contacting to at least a part of the $1^{st}$ pixel (161), preferably said $2^{nd}$ polymer of the bank (150) is directly contacting to at least a part of the $1^{st}$ polymer of the $1^{st}$ pixel (161).

More preferably, said bank (150) is photolithographically patterned and said $1^{st}$ pixel (161) is surrounded by the bank (150), preferably said $1^{st}$ pixel (161), the $2^{nd}$ pixel (162) and the $3^{rd}$ pixel (163) are all surrounded by the photolithographically patterned bank (150).

Polymer Material of the Bank

In a preferred embodiment of the present invention, said polymer material of the bank is a thermosetting resin, preferably it is a photosensitive resin, more preferably it is a thermosetting and photosensitive resin containing an alkaline soluble polymer, preferably the weight-average molecular weight of said alkaline soluble polymer is in the range from 1,000 to 100,000, more preferably it is from 1,200 to 80,000, preferably the solid-acid value of the alkaline soluble polymer is in the range from 10 to 500 mg KOH/g, more preferably it is from 20 to 300 mg KOH/g, preferably said alkaline soluble polymer is selected from (meth)acrylate polymer, siloxane (meth)acrylate polymer, more preferably it is a methacrylate polymer, an acrylate polymer or a combination of thereof, even more preferably the polymer material is an acrylate polymer, further more preferably said bank (150) is obtained or obtainable from a bank composition containing at least one alkaline soluble polymer and a chemical compound containing at least two (meth)acryloyloxy groups, particularly preferably said bank (150) is obtained or obtainable from a bank composition containing at least one alkaline soluble polymer and a chemical compound containing at least two (meth)acryloyloxy groups and a surfactant, preferably said composition is a photosensitive composition, preferably said bank is a cured layer obtained or obtainable from the composition, more preferably said bank is a photolithographically patterned cured layer obtained or obtainable from the composition.

Surfactant of the Bank

According to the present invention, preferably said bank (150) further contains a surfactant, preferably at least a part of the surface of the bank is covered by said surfactant, more preferably the surface of the bank is hydrophobic, even more preferably the surface of the top part of the bank is oil-repellent, preferably the total amount of the surfactant is in the range from 0.001 to 5 wt. %, more preferably from 0.01 to 4 wt. %, even more preferably from 0.05 to 3 wt. %, furthermore preferably from 0.1 to 1 wt. % based on the total amount of the bank.

In a further preferable embodiment, the bank (150) contains a nonionic surfactant, preferably said nonionic surfactant is a hydrocarbon based nonionic surfactant, fluorine-based nonionic surfactant, organosilicon based nonionic surfactant or a combination of these, more preferably said hydrocarbon based nonionic surfactant is selected from one or more members the group consisting of polyoxyethylene alkyl ethers, such as polyoxyethylene lauryl ether, polyoxyethylene oleyl ether and polyoxyethylene cetyl ether; polyoxyethylene fatty acid diester; polyoxyethylene fatty acid monoester; polyoxyethylene polyoxypropylene block polymer; acetylene alcohol; acetylene glycol such as 3-methyl-1-butyne-3-ol, 3-methyl-1-pentyn-3-ol, 3,6-dimethyl-4-octyne-3,6-diol, 2,4,7,9-tetramethyl-5-decyne-4,7-diol, 3,5-dimethyl-1-hexyne-3-ol, 2,5-di-methyl-3-hexyne-2,5-diol, 2,5-di-methyl-2,5-hexanediol; polyethoxylate of acetylene alcohol; acetylene glycol derivatives, such as polyethoxylate of acetylene glycol; preferably fluorine-based nonionic surfactant is selected from one or more of fluorine-containing surfactants; preferably said hydrocarbon based nonionic surfactant is selected from organosiloxane surfactants, preferably the surfactant is a fluorine-based nonionic surfactant.

Saccharide in the Bank

In a preferred embodiment of the present invention, the bank (150) further contains a saccharide, preferably said saccharide is selected from a monosaccharide, an oligosaccharide, a polysaccharide or a mixture of thereof, more preferably it is an oligosaccharide, even more preferably said saccharide is an oligosaccharide formed by dehydrating and condensing 2 to 10 molecules of a monosaccharide, and also includes a cyclic oligosaccharide (for example, cyclodextrin), furthermore preferably it is cyclodextrin or disaccharide obtained by condensing two molecules of monosaccharide, even more preferably it is a disaccharide obtained by condensing two molecules of monosaccharide, furthermore preferably the saccharide is oligosaccharide having an alkylene oxide having 1 to 6 carbon atoms, more preferably it has an alkylene oxide having 2 to 5 carbon atoms, and further preferably it has an ethylene oxide or propylene oxide, particularly preferably it is sucrose-alkyleneoxide-lauric acid ester, preferably the total amount of the surfactant is in the range from 0.001 to 1 wt. %, more preferably from 0.1 to 60 wt. %, even more preferably from 1 to 40 wt. %, furthermore preferably from 10 to 30 wt. % based on the total solid contents of the polymer material. For examples, sucrose ethylene oxide adduct can be used preferably.

Colorant in the Bank

In a preferable embodiment of the present invention, the bank (150) further comprises a colorant, preferably said colorant is an organic colorant and/or an inorganic colorant, more preferably it is a black colorant selected from an organic black pigment and/or inorganic black pigment, preferably said black colorant has a light transmittance ratio represented by [light transmittance at the wavelength of 365 nm]/[light transmittance at the wavelength of 500 nm] of 1.2 or more, more preferably the ratio is 2.0 or more, preferably said black colorant has a light transmittance ratio represented by [light transmittance at the wavelength of 365 nm]/[light transmittance at the wavelength of 500 nm] of 5.0 or less, even more preferably it is in the range from 1.2 to 5.0, further more preferably it is from 2.0 to 4.0 provided that the transmittance is obtained by measuring a film obtained by the following steps: applying a composition in which 10 mass % of a black colorant is dispersed based on the total amount of the resin forming a film having a film thickness of 10 μm by applying said composition to a glass substrate, and curing at 100° C., then the obtained film is measured using UV-vis-NIR (Hitachi High-Technologies Corporation), preferably said inorganic black pigment is zirconium nitride, preferably said organic black pigment is a mixture of two or more organic color pigments, more preferably it is a mixture of red, green blue organic color pigments configured to show black color by mixing, further more preferably said organic black pigment is a mixture selected from the group consisting of an azo type, a phthalocyanine type, a quinacridone type, a benzimidazolone type, an isoindolinone type, a dioxazine type, an indanthrene type and a perylene type organic pigments, particularly preferably said organic black pigment is a mixture of one selected from the group consisting of C. I. Pigment Orange 43, C. I. Pigment Orange 64 and C. I. Pigment Orange 72, with C. I. Pigment Blue 60, C. I. Pigment Green 7, C. I. Pigment Green 36 and C. I. Pigment Green 58.

Preferably, the total amount of said colorant is 3 to 80 wt. %, preferably 5 to 50 wt. % based on the total amount of the polymer material of the bank.

Supporting Medium (170)

In some embodiments of the present invention, said supporting medium (170) is a substrate, more preferably it is a transparent substrate.

In general, said substrate such as a transparent substrate can be flexible, semi-rigid or rigid.

Publicly known transparent substrate suitable for optical devices can be used as desired.

Preferably, as a transparent substrate, a transparent polymer substrate, glass substrate, thin glass substrate stacked on a transparent polymer film, transparent metal oxides (for example, oxide silicone, oxide aluminum, oxide titanium), polymer film substrate with transparent metal oxides, can be used. Even more preferably it is a transparent polymer substrate or a glass substrate.

A transparent polymer substrate can be made from polyethylene, ethylene-vinyl acetate copolymer, ethylene-vinyl alcohol copolymer, polypropylene, polystyrene, polymethyl methacrylate, polyvinylchloride, polyvinyl alcohol, polyvinylvutyral, nylon, polyether ether ketone, polysulfone, polyether sulfone, tetrafluoroethylene-erfluoroalkylvinyl ether copolymer, polyvinyl fluoride, tetraflyoroethylene ethylene copolymer, tetrafluoroethylene hexafluoro polymer copolymer, or a combination of any of these.

The term "transparent" means at least around 60% of incident light transmittal at the thickness used in a photovoltaic device and at a wavelength or a range of wavelength used during operation of photovoltaic cells. Preferably, it is over 70%, more preferably, over 75%, the most preferably, it is over 80%.

The Composition and (meth)acrylate monomer

According to the present invention, in some embodiments, the 1st pixel (161) is obtained or obtainable from the composition, or is a cured layer of said composition, comprises;

i) at least one (meth)acrylate monomer represented by following chemical formula (I), and ii) another material;

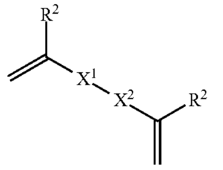

(I)

wherein $X^1$ is a non-substituted or substituted alkyl group, aryl group or an alkoxy group or an ester group;

$X^2$ is a non-substituted or substituted alkyl group, aryl group or an alkoxy group or an ester group;

$R^1$ is a hydrogen atom, halogen atom of Cl, Br, or F, methyl group, alkyl group, aryl group, alkoxy group, ester group, or a carboxylic acid group;

$R^2$ is a hydrogen atom, halogen atom of Cl, Br, or F, methyl group, alkyl group, aryl group, alkoxy group, ester group, or a carboxylic acid group;

preferably the symbol $X^1$ is

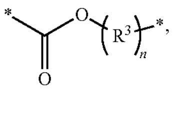

where "*" on the left side of the formula represents the connecting point to the carbon atom of the end group $C{=}CR^1$ of the formula (I) and "*" on the right side represents the connecting point to symbol $X^2$ of the formula (I);

n is 0 or 1;

preferably the symbol $X^2$ is

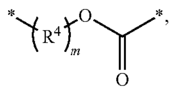

where "*" on the left side of the formula represents the connecting point to symbol X1 of the formula (I) and "*" on the right side represents the connecting point to the end group $C{=}CR^2$ of the formula (I);

m is 0 or 1;

preferably at least m or n is 1;

$R^3$ is a straight alkylene chain or alkoxylene chain having 1 to 25 carbon atoms, a cycloalkane having 3 to 25 carbon atoms or an aryl group having 3 to 25 carbon atoms, preferably $R^3$ is a straight alkylene chain or alkoxylene chain having 1 to 15 carbon atoms, more preferably 1 to 5 carbon atoms, which may be substituted by one or more radicals $R^a$, where one or more non-adjacent $CH_2$ groups may be replaced by $R^aC{=}CR^a$, $C{\equiv}C$, $Si(R^a)_2$, $Ge(R^a)_2$, $Sn(R^a)_2$, $C{=}O$, $C{=}S$, $C{=}Se$, $C{=}NR^a$, $P({=}O)(R^a)$, SO, SO2, $NR^a$, OS, or $CONR^a$ and where one or more H atoms may be replaced by D, F, Cl, Br, I, CN or $NO_2$;

$R^4$ is a straight alkylene chain or alkoxylene chain having 1 to 25 carbon atoms, a cycloalkane having 3 to 25 carbon atoms or an aryl group having 3 to 25 carbon atoms, preferably $R^4$ is a straight alkylene chain or alkoxylene chain having 1 to 15 carbon atoms, more preferably 1 to 5 carbon atoms, which may be substituted by one or more radicals $R^a$, where one or more non-adjacent $CH_2$ groups may be replaced by $R^aC{=}CR^a$, $C{\equiv}C$, $Si(R^a)_2$, $Ge(R^a)_2$, $Sn(R^a)_2$, $C{=}O$, $C{=}S$, $C{=}Se$, $C{=}NR^a$, $P({=}O)(R^a)$, SO, SO2, $NR^a$, OS, or $CONR^a$ and where one or more H atoms may be replaced by D, F, Cl, Br, I, CN or $NO_2$;

$R^a$ is at each occurrence, identically or differently, H, D or an alkyl group having 1 to 20 carbon atoms, cyclic alkyl or alkoxy group having 3 to 40 carbon atoms, an aromatic ring system having 5 to 60 carbon ring atoms, or a hetero aromatic ring system having 5 to 60 carbon atoms, wherein H atoms may be replaced by D, F, Cl, Br, I; two or more adjacent substituents $R^a$ here may also form a mono- or polycyclic, aliphatic, aromatic or heteroaromatic ring system with one another.

In a preferred embodiment of the present invention, the viscosity of the composition is 35 cP or less at room temperature, preferably in the range from 1 to 35 cP, more preferably from 2 to 30 cP, even more preferably from 2 to 25 cP.

According to the present invention, said viscosity can be measured by vibration type viscometer VM-10A (SEKONIC) at room temperature. https://www.sekonic-.co.jp/english/product/viscometer/vm/vm_series.html (Meth)Acrylate Monomer Represented by Chemical Formula (I) as a Matrix Material It is believed that the lower viscosity is important to make a low viscosity composition suitable for inkjet printing. Therefore, a (meth)acrylate monomer having the viscosity value within the above-mentioned parameter ranges are especially suitable to make a composition for inkjet printing. By using these (meth)acrylate monomer in a composition, when it is mixed with another material such as semiconducting light emitting nanoparticles with high loading, the composition can still keep lower viscosity within the range suitable for inkjet printing.

In a preferred embodiment of the present invention, the boiling point (B.P.) of said (meth)acrylate monomer of chemical formula (I) is 250° C. or more, preferably it is in the range from 250° C. to 350° C., even more preferably from 280° C. to 350° C., further more preferably from 300° C. to 348° C. for large area uniform inkjet printing.

It is believed that said high boiling point is also important to make a composition having a lower vapor pressure preferably less than 0.001 mmHg for large area uniform printing, it is preferable to use a (meth)acrylate monomer of formula (I) having the viscosity value of 25 cP or less at 25° C. and the boiling point at least 250° C. or more, preferably it is in the range from 250° C. to 350° C., more preferably from 300° C. to 348° C. to make a composition suitable for large area uniform inkjet printing even if it is mixed with high loading of another materials such as high loading of semiconducting light emitting nanoparticles.

According to the present invention, said B.P can be estimate by the known method such as like described in Science of Petroleum, Vol. II. p. 1281 (1398), https://www.sigmaaldrich.com/chemistry/solvents/learning-center/nomograph.html.

According to the present invention, any types of publicly available acrylates and/or methacrylates represented by chemical formula (I) can be used preferably.

Especially for the first aspect, any types of publicly available acrylates and/or methacrylates having the viscosity value of 25 cP or less at 25° C. represented by chemical formula (I) can be used.

Furthermore preferably, said $R^3$ of formula (I) and $R^4$ of formula (I) are, each independently of each other, selected from the following groups, wherein the groups can be substituted with $R^a$, preferably they are unsubstituted by $R^a$.

$*-(CH_2)_1-*$ $*-(CH_2)_2-*$ $*-(CH_2)_3-*$ $*-(CH_2)_4-*$ $*-(CH_2)_5-*$ $*-(CH_2)_6-*$ $*-(CH_2)_7-*$

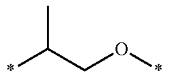

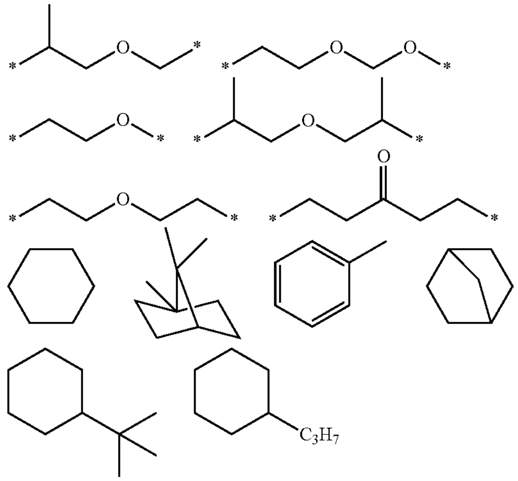

-continued

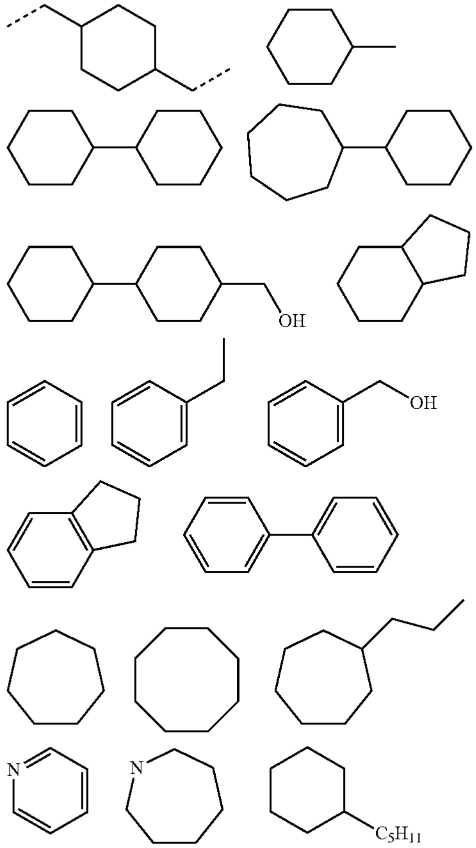

Particularly preferably, said $R^3$ and $R^4$ of formula (I) are, at each occurrence, independently or differently, selected from the following groups.

$*-(CH_2)_1-*$ $*-(CH_2)_2-*$ $*-(CH_2)_3-*$ $*-(CH_2)_4-*$ $*-(CH_2)_5-*$ $*-(CH_2)_6-*$ $*-(CH_2)_4-*$

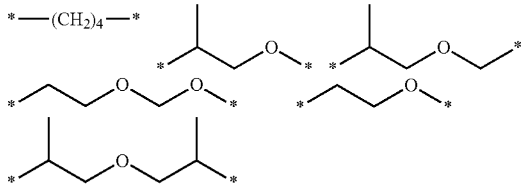

wherein "*" represents the connecting point to oxygen atom of the formula or the connecting point to $X^2$ of the formula in case of $R^3$, and wherein "*" represents the connecting point to oxygen atom of the formula or the connecting point to $X^1$ of the formula in case of $R^4$.

Furthermore preferably, said formula (I) is NDDA (BP: 342° C.), HDDMA (BP:307) or DPGDA (BP: 314° C.).

(NDDA)

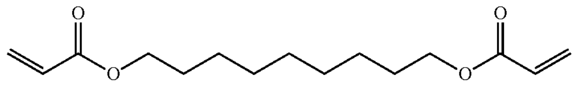

-continued (HDDMA)

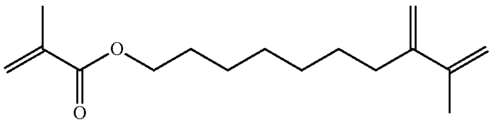

(DPGDA)

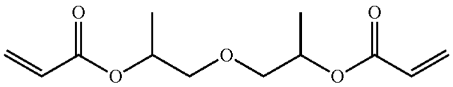

In some embodiments of the present invention, the composition further comprises another (meth)acrylate monomer represented by following chemical formula (II);

(II)

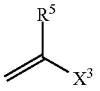

$X^3$ is a non-substituted or substituted alkyl group, aryl group or an alkoxy group;

preferably the symbol $X^3$ is

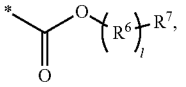

where "*" on the left side of the formula represents the connecting point to the end group $C{=}CR^5$ of the formula (I);

I is 0 or 1;

$R^5$ is a hydrogen atom, halogen atom of Cl, Br, or F, methyl group, alkyl group, aryl group, alkoxy group, ester group, or a carboxylic acid group;

$R^6$ is a straight alkylene chain or alkoxylene chain having 1 to 25 carbon atoms, preferably $R^6$ is a straight alkylene chain or alkoxylene chain having 1 to 15 carbon atoms, more preferably 1 to 5 carbon atoms, which may be substituted by one or more radicals $R^a$, where one or more non-adjacent $CH_2$ groups may be replaced by $R^aC{=}CR^a$, C≡C, $Si(R^a)_2$, $Ge(R^a)_2$, $Sn(R^a)_2$, C═O, C═S, C═Se, $C{=}NR^a$, $P({=}O)(R^a)$, SO, SO2, $NR^a$, OS, or $CONR^a$ and where one or more H atoms may be replaced by D, F, Cl, Br, I, CN or $NO_2$;

$R^7$ is a straight alkylene chain or alkoxylene chain having 1 to 25 carbon atoms, preferably $R^7$ is a straight alkylene chain or alkoxylene chain having 1 to 15 carbon atoms, more preferably 1 to 5 carbon atoms, which may be substituted by one or more radicals $R^a$, where one or more non-adjacent $CH_2$ groups may be replaced by $R^aC{=}CR^a$, CC, $Si(R^a)_2$, $Ge(R^a)_2$, $Sn(R^a)_2$, C═O, C═S, C═Se, $C{=}NR^a$, $P({=}O)(R^a)$, SO, SO2, $NR^a$, OS, or $CONR^a$ and where one or more H atoms may be replaced by D, F, Cl, Br, I, CN or $NO_2$;

$R^a$ is at each occurrence, identically or differently, H, D or an alkyl group having 1 to 20 carbon atoms, cyclic alkyl or alkoxy group having 3 to 40 carbon atoms, an aromatic ring system having 5 to 60 carbon ring atoms, or a hetero aromatic ring system having 5 to 60 carbon atoms, wherein H atoms may be replaced by D, F, Cl, Br, I; two or more adjacent substituents $R^a$ here may also form a mono- or polycyclic, aliphatic, aromatic or heteroaromatic ring system with one another.

(Meth)Acrylate Monomer Represented by Chemical Formula (II)

It is believed that the (meth)acrylate monomer represented by following chemical formula (II) shows much lower viscosity value than the viscosity of the (meth)acrylate monomer of formula (I). Thus, by using the (meth)acrylate monomer represented by chemical formula (II) in combination of the (meth)acrylate monomer of chemical formula (I), a composition having much lower viscosity desirable for smooth inkjet printing can be realized, preferably without decreasing External Quantum Efficiency (EQE) value.

It is believed that said combination can realize a low viscosity composition comprising high amount of another materials, such as high loading of semiconducting light emitting nanoparticles. Thus, it is especially suitable for an inkjet printing when the composition comprises another material.

In a preferable embodiment of the present invention, the boiling point (B.P.) of said (meth)acrylate monomer of chemical formula (II) is 250° C. or more, preferably the (meth)acrylate monomer of chemical formula (II) is 250° C. or more, more preferably it is in the range from 250° C. to 350° C., even more preferably from 280° C. to 350° C., further more preferably from 300° C. to 348° C. for large area uniform inkjet printing.

In a further preferable embodiment of the present invention, the boiling point (B.P.) of said (meth)acrylate monomer of chemical formula (I) and/or the boiling point (B.P.) of said (meth)acrylate monomer of chemical formula (II) is 250° C. or more, preferably the (meth)acrylate monomers of chemical formula (I) and chemical formula (II) are both 250° C. or more, more preferably it is in the range from 250° C. to 350° C., even more preferably from 280° C. to 350° C., further more preferably from 300° C. to 348° C. for large area uniform inkjet printing.

Furthermore preferably, said $R^7$ of formula (II) is, at each occurrence, independently or differently, selected from the following groups, wherein the groups can be substituted with $R^a$, preferably they are unsubstituted by $R^a$.

| | | |
|---|---|---|
| $*{-}(CH_2)_6{-}CH_3$ | $*{-}(CH_2)_7{-}CH_3$ | $*{-}(CH_2)_8{-}CH_3$ |
| $*{-}(CH_2)_9{-}CH_3$ | $*{-}(CH_2)_{10}{-}CH_3$ | $*{-}(CH_2)_{11}{-}CH_3$ |
| $*{-}(CH_2)_{12}{-}CH_3$ | $*{-}(CH_2)_4{-}OH$ | $*{-}(CH_2)_2{-}OH$ |
| $*{-}(CH_2)_6{-}OH$ | $*{-}(CH_2)_3{-}OH$ | $*{-}(CH_2)_5{-}OH$ |

wherein "*" represents the connecting point to $R^6$ of $X^3$ in case I is 1, and it is representing the connecting point to oxygen atom of $X^3$ of the formula (II) in case n is 0.

The furthermore preferably, said formula (II) is Lauryl methacrylate (LM, viscosity 6 cP, BP: 142° C.) or Lauryl acrylate (LA, viscosity: 4.0 cP, BP: 313.2° C.).

In a preferred embodiment of the present invention, the (meth)acrylate monomer of chemical formula (II) is in the composition and the mixing ratio of the (meth)acrylate monomer of chemical formula (I) to the (meth)acrylate monomer of chemical formula (II) is in the range from 1:99 to 99:1 (formula (I):formula (II)), preferably from 5:95 to 50:50, more preferably from 10:90 to 40:60, even more preferably it is from 15:85 to 35:65, preferably at least a purified (meth)acrylate monomer represented by chemical formula (I), (II) is used in the composition, more preferably the (meth)acrylate monomer of chemical formula (I) and the (meth)acrylate monomer of chemical formula (II) are both obtained or obtainable by a purification method.

It is believed that the higher amount of the (meth)acrylate monomer of chemical formula (II) to the total amount of the (meth)acrylate monomer of chemical formula (I) leads improved EQE of the composition, and the mixing weight ratio of the (meth)acrylate monomer of chemical formula (II) to the total amount of the (meth)acrylate monomer of chemical formula (I) less than 50 wt. % is preferable from the view point of viscosity of the composition, better ink-jetting properties of the composition.

Preferably, (meth)acrylate monomers purified by using silica column are used.

It is believed that an impurity removal from the (meth) acrylate monomers by the silica column purification leads improved QY of the semiconducting light emitting nanoparticle in the composition.

In some embodiments of the present invention, the composition further comprises a (meth)acrylate monomer represented by following chemical formula (III);

(III)

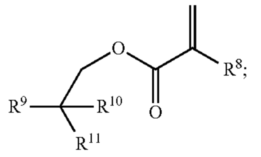

wherein $R^9$ is hydrogen atom, a straight alkyl group having 1 to 25 carbon atoms or a (meth)acryl group represented by chemical formula (IV)

(IV)

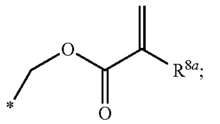

$R^6$ is hydrogen atom, a straight alkyl group having 1 to 25 carbon atoms or a (meth)acryl group represented by chemical formula (V)

(V)

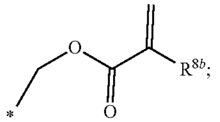

$R^7$ is hydrogen atom, a straight alkyl group having 1 to 25 carbon atoms or a (meth)acryl group represented by chemical formula (VI)

(VI)

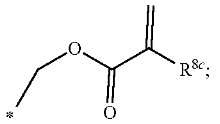

wherein $R^{8a}$, $R^{8b}$ and $R^{8c}$ are, each independently or dependently of each other at each occurrence, H or $CH_3$;

wherein at least one of $R^9$, $R^{10}$ and $R^{11}$ is a (meth)acryl group, preferably two of $R^9$, $R^{10}$ and $R^{11}$ are a (meth) acryl group and other one is a hydrogen atom or a straight alkyl group having 1 to 25 carbon atoms, preferably the electric conductivity (S/cm) of the (meth)acrylate monomer of formula (III) is $1.0*10^{-10}$ or less, preferably it is $5.0*10^{-11}$ or less, more preferably it is in the range from $5.0*10^{-11}$ to $1.0*10^{-15}$, even more preferably it is in the range from $5.0*10^{-12}$ to $1.0*10^{-15}$.

It is believed that the (meth)acrylate monomer of chemical formula (III) is useful to improve its solidity of a later made from the composition after inkjet printing.

According to the present invention, a publicly known a (meth)acrylate monomer represented by following chemical formula (III) can be used to improve solidity of a layer after inkjet printing and cross linking.

Very preferably, Trimethylolpropane Triacrylate (TMPTA) is used as the (meth)acrylate monomer of chemical formula (III).

In a preferable embodiment of the present invention, the amount of the (meth)acrylate monomer of chemical formula (III) based on the total amount of (meth)acrylate monomers in the composition is in the range from 0.001 wt. % to 25 wt. %, more preferably in the range from 0.1 wt. % to 15 wt. %, even more preferably from 1 wt. % to 10 wt. %, further more preferably from 3 to 7 wt %.

Preferably, there (meth)acrylate monomers are purified by using silica column, are used.

It is believed that an impurity removal from the (meth) acrylate monomers by the silica column purification leads improved QY of the semiconducting light emitting nanoparticle in the composition.

According to the present invention, in a preferred embodiment, the viscosity of the composition is 35 cP or less at room temperature, preferably in the range from 1 to 35 cP, more preferably from 2 to 30 cP, even more preferably from 2 to 25 cP.

In a preferred embodiment of the present invention, the composition comprises a solvent 10 wt % or less based on the total amount of the composition, more preferably it is 5 wt % or less, more preferably it is a solvent free composition, preferably the composition does not comprise any one of the following solvent selected from one or more members of the group consisting of ethylene glycol monoalkyl ethers, such as, ethylene glycol monomethyl ether, ethylene glycol monoethyl ether, ethylene glycol monopropyl ether, and ethylene glycol monobutyl ether; diethylene glycol dialkyl ethers, such as, diethylene glycol dimethyl ether, diethylene glycol diethyl ether, diethylene glycol dipropyl ether, and diethylene glycol dibutyl ether; propylene glycol monoalkyl ethers, such as, propylene glycol monomethyl ether (PGME), propylene glycol monoethyl ether, and propylene glycol monopropyl ether; ethylene glycol alkyl ether acetates, such as, methyl cellosolve acetate and ethyl cellosolve acetate; propylene glycol alkyl ether acetates, such as, propylene glycol monomethyl ether acetate (PGMEA), propylene glycol monoethyl ether acetate, and propylene glycol monopropyl ether acetate; ketones, such as, methyl ethyl ketone, acetone, methyl amyl ketone, methyl isobutyl ketone, and cyclohexanone; alcohols, such as, ethanol, propanol, butanol, hexanol, cyclo hexanol, ethylene glycol, triethylene glycol and glycerin; esters, such as, ethyl 3-ethoxypropionate, methyl 3-methoxypropionate and ethyl lactate; and cyclic asters, such as, gamma-butyro-lactone; chlorinated hydrocarbons, such as chloroform, dichloromethane, chlorobenzene, trimethyl benzenes such as 1,3,5-trimethylbenzene, 1,2,4-trimethyl benzene, 1,2,3-trimethyl benzene, docecylbenzene, cyclohexylbenzene, 1,2,3,4-tetramethylbenzene, 1,2,3,5-tetramethylbenzene, 3-isopropylbiphenyl, 3-methylbiphenyl, 4-methylbiphenyl and dichlorobenzene, preferably said solvent is propylene glycol alkyl ether acetates, alkyl acetates, ethylene glycol monoalkyl ethers, propylene glycol, and propylene glycol monoalkyl ethers.

It is believed that the less than 10 wt % of solvent in the composition leads improved ink-jetting and it can avoid $2^{nd}$ or more ink-jetting onto the same pixel after evaporation of the solvent.

According to the present invention, preferably the composition further comprises an another material selected from one or more members of the group consisting of;

iii) at least one semiconducting light emitting nanoparticle comprising a $1^{st}$ semiconducting nanoparticle, optionally one or more shell layers covering at least a part of the $1^{st}$ semiconducting nanoparticle, preferably said nanoparticle comprises a ligand, more preferably said nanoparticle comprises a alkyl type ligand having carbon atoms 2 to 25, preferably from 6 to 15 (such as C12, C8);

iv) another (meth)acrylate monomer;

v) scattering particles, and vi) optically transparent polymers, anti-oxidants, radical quenchers, photo initiators and/or surfactants.

In some embodiments of the present invention, preferably the composition of the present invention comprises v) scattering particles; and vii) at least one polymer configured so that said polymer enables to the scattering particles to disperse in the composition;

wherein the polymer comprises at least a phosphine group, phosphine oxide group, phosphate group, phosphonate group, thiol group, tertiary amine, carboxyl group, hetero cyclic group, silane group, sulfonic acid, hydroxyl group, phosphonic acid, or a combination of thereof, preferably the polymer comprises a tertiary amine, phosphine oxide group, phosphonic acid, or a phosphate group.

According to the present invention, the polymer configured so that said polymer enables to the scattering particles to disperse in the composition comprises at least a repeating unit A comprising a phosphine group, phosphine oxide group, phosphate group, phosphonate group, thiol group, tertiary amine, carboxyl group, hetero cyclic group, silane group, sulfonic acid, hydroxyl group, phosphonic acid, or a combination of thereof, preferably the repeating unit A comprises a tertiary amine, phosphine oxide group, phosphonic acid, or a phosphate group.

In some embodiments of the present invention, the repeating unit A and the repeating unit B are a constitutional repeating unit.

Even more preferably, the repeating unit A comprises a tertiary amine represented by following chemical formula (VII), $$NR^{12}R^{13}R^{14}\text{—} \quad (VII)$$

wherein $R^{12}$ is a hydrogen atom, a straight or a branched alkyl group having 1 to 30 carbon atoms, or an aryl group having 1 to 30 carbon atoms; $R^{13}$ is a hydrogen atom, a straight or a branched alkyl group having 1 to 30 carbon atoms, or an aryl group having 1 to 30 carbon atoms; $R^{12}$ and $R^{13}$ can be same or different of each other; $R^{14}$ is a single bond, a straight or a branched alkylene group having 1 to 30 carbon atoms, alkenylene group having 1 to 30 carbon atoms, (poly) oxaalkylene group having 1 to 30 carbon atoms.

Even more preferably, $R^{12}$ is a straight or a branched alkyl group having 1 to 30 carbon atoms; $R^{13}$ is a straight or a branched alkyl group having 1 to 30 carbon atoms; $R^{12}$ and $R^{13}$ can be same or different of each other.

Furthermore preferably, $R^{12}$ is methyl group, ethyl group, n-propyl group, or n-butyl group; $R^{13}$ is methyl group, ethyl group, n-propyl group, or n-butyl group.

According to the present invention, in a preferred embodiment, the repeating unit A does not contain a salt.

In a preferred embodiment of the present invention, the polymer is a copolymer selected from the group consisting of graft copolymers, block copolymers, alternating copolymers, and random copolymers, preferably said copolymer comprises the repeating unit A, and repeating unit B that does not include any phosphine group, phosphine oxide group, phosphate group, phosphonate group, thiol group, tertiary amine, carboxyl group, hetero cyclic group, silane group, sulfonic acid, hydroxyl group, phosphonic acid, and a combination of thereof, more preferably the copolymer is a block copolymer represented by following chemical formula (VIII) or (IX), $$A_n\text{-}B_m \quad (VIII)$$

$$B_o\text{-}A_n\text{-}B_m \quad (IX)$$

wherein the symbol "A" represents a repeating unit A; the symbol "B" is taken to mean the repeating unit B; the symbols "n", "m", and "o" are at each occurrence, independently or dependently of each other, integers 1 to 100, preferably 5 to 75, more preferably 7 to 50; even more preferably the repeating unit B comprises a polymer chain selected from the group consisting of (poly)ethylene, (poly)phenylene, polydivinylbenzene, (poly)ethers, (poly)esters, (poly)amides, (poly)urethanes, (poly)carbonates, polylactic acids, (poly)vinyl esters, (poly)vinyl ethers, polyvinyl alcohols, polyvinylpyrrolidones, celluloses and derivatives of any of these.

In a preferred embodiment of the present invention, the polymer chain of the repeating unit B is a polyethylene glycol.

More preferably, the repeating unit B comprises a chemical structure represented by following chemical formula (X), Chemical formula (X)

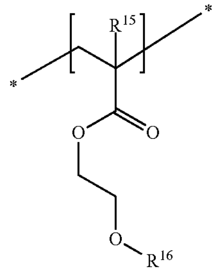

wherein the chemical formula (X), $R^{15}$ is hydrogen atom, or methyl group; $R^{16}$ is alkyl group having 1 to 10 carbon atoms; and n is an integer 1 to 5, "*" represents the connecting point to an another polymer repeating unit or a terminal of the polymer.

Even more preferably, $R^{15}$ can be a hydrogen atom, or methyl group, $R^{16}$ can be an ethyl group, and n is an integer 1 to 5.

In some embodiments of the present invention, the surface of the core, or the outermost surface of one or more shell layers of the semiconducting light emitting nanoparticle can be partly or fully over coated by the polymer. By using ligand exchange method, described in for example, Thomas Nann, Chem. Commun., 2005, 1735-1736, DOI: 10.1039/b-414807j, the polymer can be introduced onto the surface of the core or the outermost surface of the core of the semiconducting light emitting nanoparticle.

According to the present invention, in some embodiments, the content of said polymer is in the range from 1% to 500% by weight, more preferably in the range from 20% to 350% by weight, even more preferably from 50% to 200% by weight with respect to the total weight of the semiconducting light emitting nanoparticle.

In a preferred embodiment of the present invention, the weight average molecular weight (Mw) of the polymer is in the range from 200 g/mol to 30,000 g/mol, preferably from 250 g/mol to 2,000 g/mol, more preferably from 400 g/mol to 1,000 g/mol.

The molecular weight MW is determined by means of GPC (=gel permeation chromatography) against an internal polystyrene standard.

As the polymer, commercially available wetting and dispersing additives which can be solved in non-polar and/or low polar organic solvent can be used preferably. Such as BYK-111, BYK-LPN6919, BYK-103, BYK-P104, BYK-163 ([trademark], from BYK com.), TERPLUS MD1000 series, such as MD1000, MD1100 ([trademark], from Otsuka Chemical), Poly(ethylene glycol) methyl ether amine (Sigma-Ald 767565 [trademark], from Sigma Aldrich), Polyester bis-MPA dendron, 32 hydroxyl, 1 thiol, (Sigma-Ald 767115 [trademark], from Sigma Aldrich), LIPONOL DA-T/25 (From Lion Specialty Chemicals Co.), Carboxymethyl cellulose (from Polyscience etc.), another wetting and dispersing additives disclosed in for examples, "Marc Thiry et. al., ACSNANO, American Chemical society, Vol. 5, No. 6, pp 4965-4973, 2011", "Kimihiro Susumu, et. al., J. Am. Chem. Soc. 2011, 133, pp 9480-9496".

Thus, in some embodiments of the present invention, the composition comprises at least the (meth)acrylate monomer of chemical formula (I), the (meth)acrylate monomer of chemical formula (II) and the polymer configured so that said polymer enables to the scattering particles to disperse in the composition, wherein the mixing ratio of the (meth) acrylate monomer of chemical formula (I): the (meth)acrylate monomer of chemical formula (II): the polymer is 10:89:1 to 50:40:10, preferably in the range from 15:82:3 to 30:60:10.

In some embodiment of the present invention, a composition comprises, essentially consisting of or consisting of, at least a polymer derived or derivable from the (meth)acrylate monomers of the composition of the present invention.

In a preferred embodiment of the present invention, said polymer is derived or derivable from all the (meth)acrylate monomers in the composition, for example, at least the (meth)acrylate monomer of chemical formula (I) and/or the (meth)acrylate monomer of chemical formula (II).

Ligands

In some embodiments of the present invention, optionally, the semiconducting light emitting nanoparticle can be directly over coated by one or more ligands, or the outer most surface of the inorganic part of the semiconducting light emitting nanoparticle can be directly coated by the additional ligand and the additional ligand is further coated by the polymer.

As the additional ligands, phosphines and phosphine oxides such as Trioctylphosphine oxide (TOPO), Trioctylphosphine (TOP), and Tributylphosphine (TBP); phosphonic acids such as Dodecylphosphonic acid (DDPA), Tridecylphosphonic acid (TDPA), Octadecylphosphonic acid (ODPA), and Hexylphosphonic acid (HPA); amines such as Oleylamine, Dedecyl amine (DDA), Tetradecyl amine (TDA), Hexadecyl amine (HDA), and Octadecyl amine (ODA), Oleylamine (OLA), 1-Octadecene (ODE), thiols such as hexadecane thiol and hexane thiol; mercapto carboxylic acids such as mercapto propionic acid and mercaptoundecanoicacid; carboxylic acids such as oleic acid, stearic acid, myristic acid; acetic acid, Polyethylenimine (PEI), monofunctional PEG thiol (mPEG-thiol) or a derivatives of mPEG thiol and a combination of any of these can be used.

Examples of such ligands have been described in, for example, the laid-open international patent application No. WO 2012/059931A.

v) Scattering Particles

According to the present invention, as the scattering particles, publicly known small particles of inorganic oxides such as $SiO_2$, $SnO_2$, CuO, CoO, $Al_2O_3$ $TiO_2$, $Fe_2O_3$, $Y_2O_3$, ZnO, ZnS, MgO; organic particles such as polymerized polystyrene, polymerized PMMA; inorganic hollow oxides such as hollow silica or a combination of any of these; can be used. The amount of the scattering particles is preferably 4 wt % or less based on the total amount of the solid contents of the layer, preferably it is in the range from 4 to 0 wt %, more preferably it is in the range from 1 to 0 wt %, more preferably the layer and/or the composition does not contain any scattering particles.

In some embodiments of the present invention, the composition comprises iii) at least one semiconducting light emitting nanoparticle comprising a $1^{st}$ semiconducting nanoparticle, optionally one or more shell layers covering at least a part of the $1^{st}$ semiconducting nanoparticle, preferably the composition has EQE value 23% or more, preferably 24% or more and less than 95%.

According to the present invention, as a transparent polymer, a wide variety of publicly known transparent polymers suitable for optical devices, described in for example, WO 2016/134820A can be used preferably.

According to the present invention, the term "transparent" means at least around 60% of incident light transmit at the thickness used in an optical medium and at a wavelength or a range of wavelength used during operation of an optical medium. Preferably, it is over 70%, more preferably, over 75%, the most preferably, it is over 80%.

According to the present invention the term "polymer" means a material having a repeating unit and having the weight average molecular weight (Mw) 1000 g/mol, or more.

The molecular weight MW is determined by means of GPC (=gel permeation chromatography) against an internal polystyrene standard.

In some embodiments of the present invention, the glass transition temperature (Tg) of the transparent polymer is 70° C. or more and 250° C. or less.

Tg is measured based on changes in the heat capacity observed in Differential scanning colorimetry like described in http://pslc.ws/macrog/dsc.htm; Rickey J Seyler, Assignment of the Glass Transition, ASTM publication code number (PCN) 04-012490-50.

For example, as the transparent polymer for the transparent matrix material, poly(meth)acrylates, epoxys, polyurethanes, polysiloxanes, can be used preferably.

In a preferred embodiment of the present invention, the weight average molecular weight (Mw) of the polymer as the transparent matrix material is in the range from 1,000 to 300,000 g/mol, more preferably it is from 10,000 to 250,000 g/mol.

According to the present invention, publicly known antioxidants, radical quenchers, photo initiators and/or surfactants can be used preferably like described in WO 2016/134820A.

QY Calculation

Quantum Yield (QY) measurements of composition are carried out by using Absolute PL quantum yield spectrometer C9920-02 (Hamamatsu Photonics K.K.), and following formula is used.

Quantum yield (QY)=emitted photon number from the sample/absorbed photon number of the sample.

In order to enhance out-coupling efficiency from an optical medium comprising the semiconducting light emitting nanoparticle, for example, a quantum sized material containing optical film, several methods are proposed, such as incorporating scattering particles in the film and/or the adjacent films, reduce the refractive index of the film by incorporating hollow silica particles, and placing suitable shape structure (cf. Proceedings of SPIE, P. 184, 5519-33, 2004). Among them, placing the structured film upon the quantum materials containing film is the most suitable for large TV application in which local dimming technique is applied to achieve high dynamic range. The scattering particles are detrimental to the dimming technique, since the scattered light causes a color blur and reducing the refractive index of the film enough for a practical level is difficult because of the limited volume for the hollow silica particles. The combination of reducing the refractive index and placing the structured film can be also applied.

Bank Composition the bank (150) is obtained or obtainable from, or a cured layer of the bank composition comprises at least (I) an alkaline soluble polymer, (II) a polymerization initiator, and (III) a chemical compound containing at least two (meth) acryloyloxy groups, preferably said composition is a photosensitive composition, preferably said at least two(meth)acryloyloxy groups are two or more acryloyloxy groups, methacryloyloxy groups or a combination of these, preferably the total amount of the chemical compound containing said at least two (meth)acryloyloxy groups based on the total amount of the alkaline soluble polymer is in the range from 5 wt. % to 1,000 wt. %, more preferably from 10 wt. % to 500 wt. %, even more preferably it is from 15 wt. % to 300 wt. % from the viewpoint of compatibility with resin., preferably said chemical compound is a monomer having the molecular weight 2000 or less, more preferably in the range from 2000 to 50, even more preferably from 1000 to 100. Preferably it is relatively smaller than the alkali-soluble polymer from the viewpoint of reactivity.

Here, the term "(meth)acryloyloxy group" is a general term for the acryloyloxy group and the methacryloyloxy group. This compound is a compound that can form a crosslinked structure by reacting with the alkali-soluble polymer. Here, in order to form a crosslinked structure, a compound containing two or more acryloyloxy groups or methacryloyloxy groups, which are reactive groups, is needed, and in order to form a higher-order crosslinked structure, it preferably contains three or more acryloyloxy groups or methacryloyloxy groups.

Further, the (meth)acryloyloxy group-containing compounds can be used alone or in combination of two or more.

Preferably said chemical compound containing at least two (meth)acryloyloxy groups, is a poly acrylate monomer having at least three (meth)acryloyloxy groups, more preferably it is a poly acrylate monomer selected from one or more member of the group consisting of a poly acrylate monomer having three (meth)acryloyloxy groups, a poly acrylate monomer having four (meth)acryloyloxy groups, a poly acrylate monomer having five (meth)acryloyloxy groups, a poly acrylate monomer having six (meth)acryloyloxy groups, even more preferably it is a poly acrylate monomer having five (meth)acryloyloxy groups, a poly acrylate monomer having six (meth)acryloyloxy groups or a mixture of thereof, preferably said poly acrylate monomer having three (meth)acryloyloxy groups is selected from one or more member of the group consisting of trimethylolpropane triacrylate, trimethylolpropaneethoxy triacrylate, trimethylolpropanepropoxy triacrylate, glycerinpropoxy triacrylate, pentaerythritol triacrylates;

preferably said poly acrylate monomer having four (meth) acryloyloxy groups is selected from one or more member of the group consisting of pentaerythritol tetraacrylates, ditrimethylolpropane tetraacrylate, pentaerythritolehoxy tetraacrylates;

preferably said poly acrylate monomer having five (meth) acryloyloxy groups is dipentaerythritol hexaacrylates, preferably said poly acrylate monomer having six (meth)acryloyloxy groups is dipentaerythritol pentaacrylate, the most preferably said chemical compound is dipentaerythritol hexaacrylates, dipentaerythritol pentaacrylate or a mixture of thereof.

Alkali-Soluble Polymer

The composition according to the present invention comprises an alkali-soluble polymer.

The alkali-soluble polymer used in the present invention preferably comprises an acryloyl group. Further, the alkali-soluble polymer used in the present invention is not particularly limited and is preferably selected from a polysiloxane containing a siloxane bond in its main skeleton, and a (meth)acrylate polymer. Among them, it is more preferable to use a methacrylate polymer, an acrylate polymer or a combination of thereof, even more preferably it is an acrylate polymer The alkali-soluble polymer used in the present invention can have a carboxyl group. By having a carboxyl group, the solubility of the alkali-soluble polymer in a low-concentration developer can be improved.

According to the present invention, the term "Alkali-soluble polymer" means a polymer soluble in 2.38% TMAH aqueous solution at 23.0±0.1° C.

(Meth)Acrylate Polymer for Bank Composition

Here, the term "(meth)acrylate" is a general term for an acrylate and a methacrylate.

According to the present invention, when a low-concentration developer is used and/or low curing temperature is applied, it is preferable to use one or more of (meth)acrylate polymers.

The alkali-soluble polymer used in the present invention can be selected from generally used methacrylate polymer, an acrylate polymer or a combination of thereof, more preferably it is an acrylic polymer, for example, polyacrylic acid, polymethacrylic acid, polyalkyl acrylate, polyalkyl methacrylate, and the like. The acrylic polymer used in the present invention preferably comprises a repeating unit containing an acryloyl group, and also preferably further comprises a repeating unit containing a carboxyl group and/or a repeating unit containing an alkoxysilyl group.

Although the repeating unit containing a carboxyl group is not particularly limited as long as it is a repeating unit containing a carboxyl group at its side chain, a repeating unit derived from an unsaturated carboxylic acid, an unsaturated carboxylic anhydride or a mixture thereof is preferable.

Although the repeating unit containing an alkoxysilyl group can be a repeating unit containing an alkoxysilyl group at its side chain, it is preferably a repeating unit derived from a monomer represented by the following formula (B):

$$X^B—(CH_2)_a—Si(ORB)_b(CH_3)_{3-b} \quad (B)$$

wherein, $X^B$ is a vinyl group, a styryl group or a (meth)acryloyloxy group, RB is a methyl group or an ethyl group, a is an integer of 0 to 3, and b is an integer of 1 to 3.

Further, it is preferable that the above-described polymer contains a repeating unit containing a hydroxyl group, which is derived from a hydroxyl group-containing unsaturated monomer.

The mass average molecular weight of the alkali-soluble polymer according to the present invention is not particularly limited, and preferably it is in the range from 1,000 to 100,000, more preferably it is from 1,200 to 80,000, even more preferably 1,000 to 40,000, furthermore preferably 2,000 to 30,000. Here, the mass average molecular weight is a mass average molecular weight in terms of polystyrene according to gel permeation chromatography. In addition, as far as the number of acid groups is concerned, preferably the solid-acid value of the alkaline soluble polymer is in the range from 10 to 500 mg KOH/g, more preferably it is from 20 to 300 mg KOH/g, even more preferably from 40 to 190 mgKOH/g, furthermore preferably 60 to 150 mgKOH/g, from the viewpoint of enabling development with a low-concentration alkaline developer and achieving both reactivity and storage stability. For examples, 2-Propenoic acid, 2-methyl-, polymer with 2-hydroxyethyl 2-methyl-2-propenoate, 2-isocyanatoethyl 2-propenoate and methyl 2-methyl-2-propenoate (C6 H10 O3·C6 H7 N O3·C5 H8 O2·C4 H6 O2)x (CAS Registry Number 1615232-03-05) can be used preferably.

Polysiloxane

The alkali-soluble polymer preferably contains a siloxane (Si—O—Si) bond as its main skeleton. In the present invention, polymer containing a siloxane bond as its main skeleton is referred to as polysiloxane. Depending on the number of the oxygen atoms bonded to a silicon atom, the skeleton structure of polysiloxane can be classified as follows: a silicone skeleton (the number of oxygen atoms bonded to a silicon atom is 2), a silsesquioxane skeleton (the number of oxygen atoms bonded to a silicon atom is 3), and a silica skeleton (the number of oxygen atoms bonded to a silicon atom is 4). In the present invention, any of these can be used. The polysiloxane molecule can contain a combination of a plurality of these skeletal structures. Preferably, polysiloxane used in the present invention contains a silsesquioxane skeleton.

Polysiloxane generally has a silanol group or an alkoxysilyl group. Such silanol group and alkoxysilyl group mean a hydroxyl group and alkoxy group directly bonded to a silicon that forms a siloxane skeleton. Here, the silanol group and alkoxysilyl group are considered to contribute to the reaction with the silicon-containing compound described below, in addition to the action of accelerating the curing reaction when forming a cured film using the composition. For this reason, it is preferable that polysiloxane has these groups.

According to the present invention, said (meth)acrylate polymer, and the Polysiloxane are not particularly limited and publicly known materials for examples like described in WO2021/018927 A1 can be used preferably.

Polymerization Initiator

The bank composition according to the present invention may comprise a polymerization initiator.

Surfactant

Further, the composition according to the present invention can optionally comprise a surfactant.

Saccharide

In a preferred embodiment of the present invention, the bank composition can further comprise a saccharide Colorant In a preferred embodiment of the present invention, the bank composition can further comprise a colorant.

Solvent

In a preferred embodiment of the present invention, the bank composition can further comprise a solvent.

Other Additives

The composition according to the present invention can optionally comprise other additives. As such additives, a developer dissolution accelerator, a scum remover, an adhesion enhancer, a polymerization inhibitor, an antifoaming agent, a surfactant, a photosensitizing enhancing agent, a crosslinking agent, a curing agent can be added.

Photosensitizing Enhancing Agent

A photosensitizing enhancing agent can be optionally added to the bank composition according to the present invention.

According to the present invention, as said polymerization initiator, surfactant, colorant, solvent, other additives and the photosensitizing enhancing agent, publicly known materials for examples like described in WO 2021/018927 A1 can be used preferably and said bank can be fabricated by a publicly known process like described in WO 2021/018927 A1.

Optical Device

In another aspect, the invention further relates to an optical device (300, 400, 500) containing at least one color conversion device (100) and a functional medium (320, 420, 520) configured to modulate a light or configured to emit light.

In some embodiments of the present invention, the optical device can be a liquid crystal display device (LCD), Organic Light Emitting Diode (OLED), backlight unit for an optical display, Light Emitting Diode device (LED), Micro Electro Mechanical Systems (here in after "MEMS"), electro wetting display, or an electrophoretic display, a lighting device, and/or a solar cell.

Figure 4:
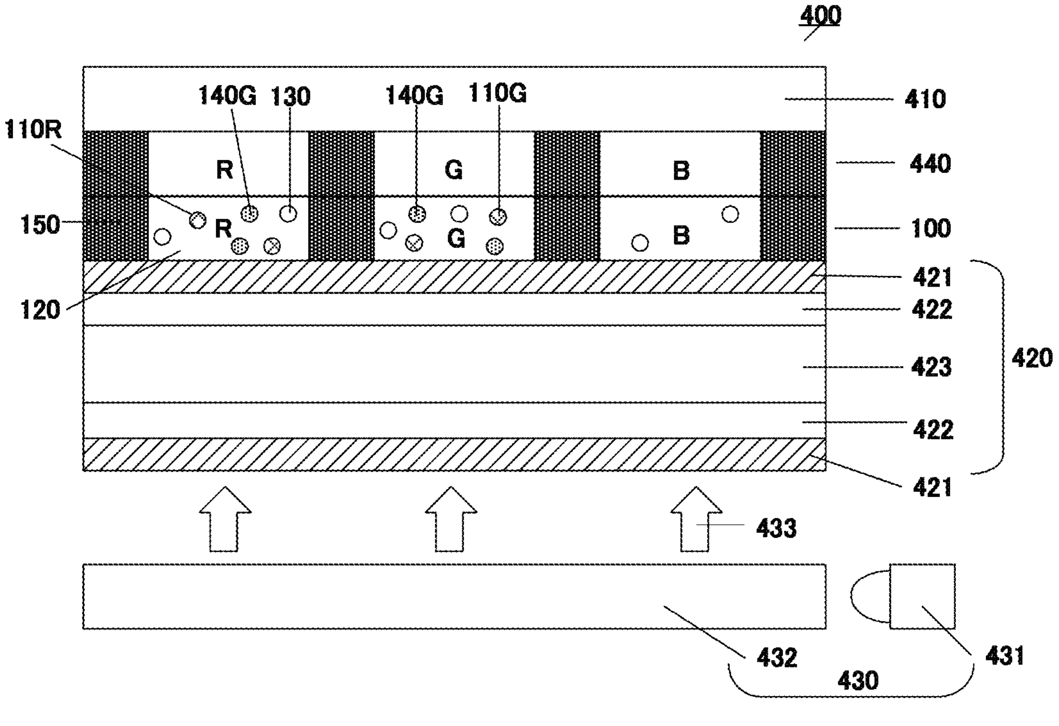
FIG. 4: shows a cross sectional view of a schematic of another embodiment of an optical device (300) of the invention.
Figure 5:
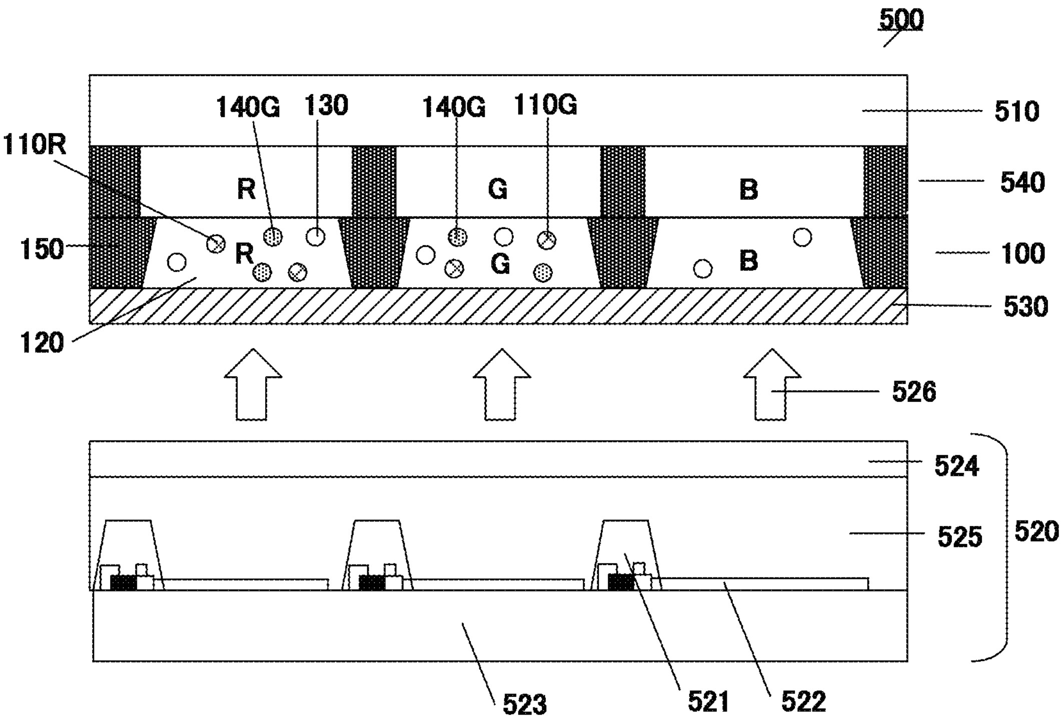
FIG. 5: shows a cross sectional view of a schematic of another embodiment of an optical device (300) of the invention.
Figure 6:
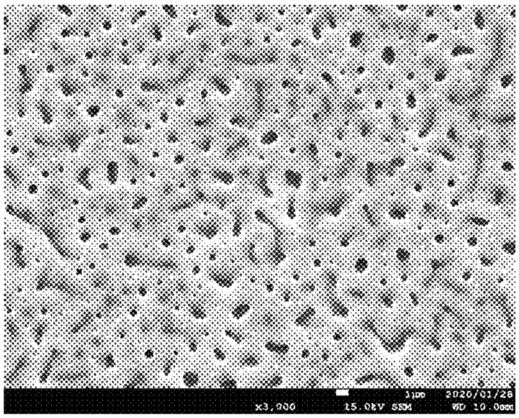
FIG. 6: shows the results of the SEM analysis of the sample B after curing (Top surface, Magnification: 3000).
Figure 7:
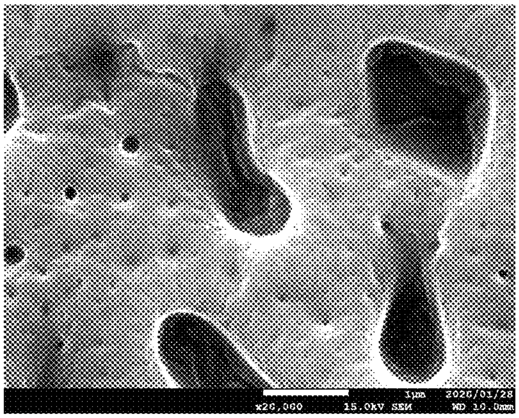
FIG. 7: shows the results of the SEM analysis of the samples B after curing (Top surface, Magnification: 20000).
Figure 8:
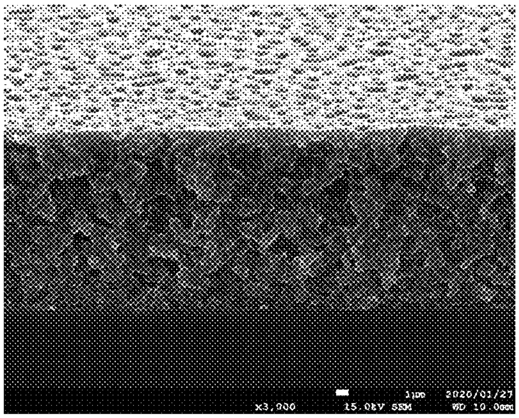
FIG. 8: shows the results of the Cross-sectional SEM analysis of the sample B after curing (Cross-section, Magnification: 3000).
Figure 9:
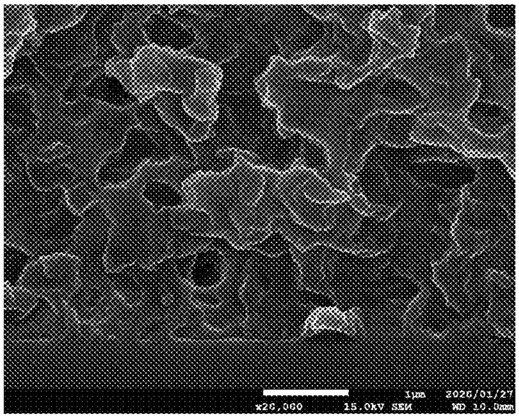
FIG. 9: shows the results of the Cross-sectional SEM analysis of the sample B after curing (Cross-section, Magnification: 20000).
Figure 10:
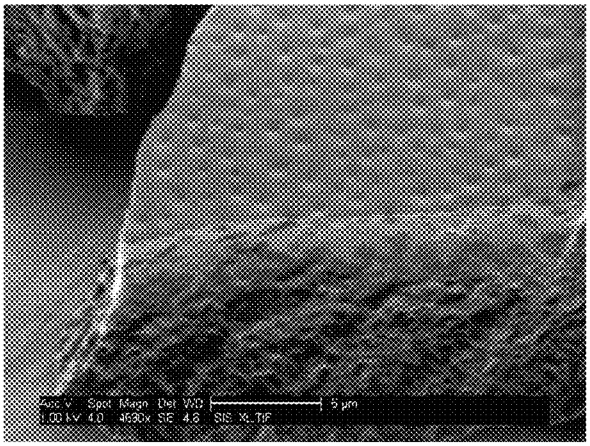
FIG. 10: shows the results of the Cross-sectional SEM analysis of the sample B after curing.
Figure 11:
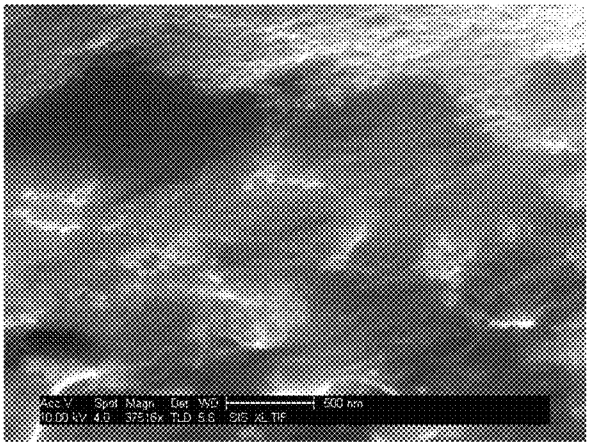
FIG. 11: shows the results of the Cross-sectional SEM analysis of the sample B after curing.

FIGS. 4 to 6 show some embodiments of the optical device of the present invention.

The term "emission" means the emission of electromagnetic waves by electron transitions in atoms and molecules.

Process

In another aspect, the invention also relates to a process for fabricating the composition of the present invention comprising, essentially consisting or consisting of:

a) mixing at least i) at least one (meth)acrylate monomer represented by following chemical formula (I) and ii) another material;

(I)

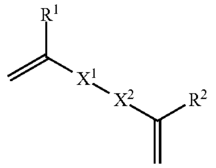

wherein $X^1$ is a non-substituted or substituted alkyl group, aryl group or an alkoxy group;

$R^1$ is a hydrogen atom, halogen atom of Cl, Br, or F, methyl group, alkyl group, aryl group, alkoxy group, ester group, or a carboxylic acid group;

$R^2$ is a hydrogen atom, halogen atom of Cl, Br, or F, methyl group, alkyl group, aryl group, alkoxy group, ester group, or a carboxylic acid group;

preferably the symbol $X^1$ is

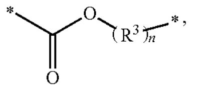

where "*" on the left side of the formula represents the connecting point to the carbon atom of the end group $C{=}CR^1$ of the formula (I) and "*" on the right side represents the connecting point to symbol $X^2$ of the formula (I);

n is 0 or 1;

preferably the symbol $X^2$ is

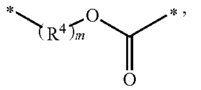

where "*" on the left side of the formula represents the connecting point to symbol X1 of the formula (I) and "*" on the right side represents the connecting point to the end group $C{=}CR^2$ of the formula (I);

m is 0 or 1;

preferably at least m or n is 1;

$R^3$ is a straight alkylene chain or alkoxylene chain having 1 to 25 carbon atoms, a cycloalkane having 3 to 25 carbon atoms or an aryl group having 3 to 25 carbon atoms, preferably $R^3$ is a straight alkylene chain or alkoxylene chain having 1 to 15 carbon atoms, more preferably 1 to 5 carbon atoms, which may be substituted by one or more radicals $R^a$, where one or more non-adjacent $CH_2$ groups may be replaced by $R^aC{=}CR^a$, $C{\equiv}C$, $Si(R^a)_2$, $Ge(R^a)_2$, $Sn(R^a)_2$, C=O, C=S, C=Se, $C{=}NR^a$, $P({=}O)(R^a)$, SO, SO2, $NR^a$, OS, or $CONR^a$ and where one or more H atoms may be replaced by D, F, Cl, Br, I, CN or $NO_2$;

$R^4$ is a straight alkylene chain or alkoxylene chain having 1 to 25 carbon atoms, a cycloalkane having 3 to 25 carbon atoms or an aryl group having 3 to 25 carbon atoms, preferably $R^4$ is a straight alkylene chain or alkoxylene chain having 1 to 15 carbon atoms, more preferably 1 to 5 carbon atoms, which may be substituted by one or more radicals $R^a$, where one or more non-adjacent $CH_2$ groups may be replaced by $R^aC{=}CR^a$, CC, $Si(R^a)_2$, $Ge(R^a)_2$, $Sn(R^a)_2$, C=O, C=S, C=Se, $C{=}NR^a$, $P({=}O)(R^a)$, SO, SO2, $NR^a$, OS, or $CONR^a$ and where one or more H atoms may be replaced by D, F, Cl, Br, I, CN or $NO_2$;

$R^a$ is at each occurrence, identically or differently, H, D or an alkyl group having 1 to 20 carbon atoms, cyclic alkyl or alkoxy group having 3 to 40 carbon atoms, an aromatic ring system having 5 to 60 carbon ring atoms, or a hetero aromatic ring system having 5 to 60 carbon atoms, wherein H atoms may be replaced by D, F, Cl, Br, I; two or more adjacent substituents $R^a$ here may also form a mono- or polycyclic, aliphatic, aromatic or heteroaromatic ring system with one another.

Preferably said another material is a (meth)acrylate monomer represented by following chemical formula (II);

(II)

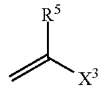

$X^3$ is a non-substituted or substituted alkyl group, aryl group or an alkoxy group;

preferably the symbol $X^3$ is

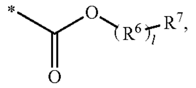

where "*" on the left side of the formula represents the connecting point to the end group $C{=}CR^5$ of the formula (I);

I is 0 or 1;

$R^5$ is a hydrogen atom, halogen atom of Cl, Br, or F, methyl group, alkyl group, aryl group, alkoxy group, ester group, or a carboxylic acid group;

$R^6$ is a straight alkylene chain or alkoxylene chain having 1 to 25 carbon atoms, preferably $R^6$ is a straight alkylene chain or alkoxylene chain having 1 to 15 carbon atoms, more preferably 1 to 5 carbon atoms, which may be substituted by one or more radicals $R^a$, where one or more non-adjacent $CH_2$ groups may be replaced by $R^aC{=}CR^a$, C=C, $Si(R^a)_2$, $Ge(R^a)_2$, $Sn(R^a)_2$, C=O, C=S, C=Se, $C{=}NR^a$, $P({=}O)(R^a)$, SO, SO2, $NR^a$, OS, or $CONR^a$ and where one or more H atoms may be replaced by D, F, Cl, Br, I, CN or $NO_2$;

$R^7$ is a straight alkylene chain or alkoxylene chain having 1 to 25 carbon atoms, preferably $R^7$ is a straight alkylene chain or alkoxylene chain having 1 to 15 carbon atoms, more preferably 1 to 5 carbon atoms, which may be substituted by one or more radicals $R^a$, where one or more non-adjacent $CH_2$ groups may be replaced by $R^aC{=}CR^a$, C=C, $Si(R^a)_2$, $Ge(R^a)_2$, $Sn(R^a)_2$, C=O, C=S, C=Se, $C{=}NR^a$, $P({=}O)(R^a)$, SO, SO2, $NR^a$, OS, or $CONR^a$ and where one or more H atoms may be replaced by D, F, Cl, Br, I, CN or $NO_2$;

$R^a$ is at each occurrence, identically or differently, H, D or an alkyl group having 1 to 20 carbon atoms, cyclic alkyl or alkoxy group having 3 to 40 carbon atoms, an aromatic ring system having 5 to 60 carbon ring atoms, or a hetero aromatic ring system having 5 to 60 carbon atoms, wherein H atoms may be replaced by D, F, Cl, Br, I; two or more adjacent substituents $R^a$ here may also form a mono- or polycyclic, aliphatic, aromatic or heteroaromatic ring system with one another.

Preferably, the mixing ratio of the (meth)acrylate monomer of chemical formula (I) to the (meth)acrylate monomer of chemical formula (II) is in the range from 1:99 to 99:1 (formula (I):formula (II)), preferably from 5:95 to 50:50, more preferably from 10:90 to 40:60, even more preferably it is from 15:85 to 35:65, preferably at least a purified (meth)acrylate monomer represented by chemical formula (I), (II) is used in the composition, more preferably the (meth)acrylate monomer of chemical formula (I) and the (meth)acrylate monomer of chemical formula (II) are both obtained or obtainable by a purification method.

Thus, in a preferable embodiment of the present invention, the method comprises a purification step of the (meth) acrylate monomers. More preferably, said purification step is taken place before step a).

More details of (meth)acrylate monomers, another material, polymer and scattering particles are described in the section of "(meth)acrylate monomer", "another material", "polymer" and "scattering particle".

Additional additives as described in the section of "additional material" can be mixed.

According to the present invention, it is desirable not to add any solvent to realize large area inkjet printing with improved uniformity without causing any clogging at a nozzle and/or with good dispersity of semiconducting light emitting nanoparticles and/or with good dispersity of scattering particles.

In another aspect, the present invention also relates to a method for fabricating a color conversion device (100) of the present invention, containing at least the following steps, preferably in this sequence;

Xi) Providing a bank composition onto a surface of a supporting medium

Xii) Curing the bank composition,

Xiii) Applying photo-patterning to the cured said composition to fabricate bank and a patterned pixel region, Xiv) Providing the composition of the present invention to at least one pixel region, preferably by ink-jetting, Xv) Curing the composition, preferably said color conversion device (100) further contains a supporting medium (170).

In another aspect, the present invention further relates to a color conversion device (100) obtainable or obtained from the method of the present invention.

In another aspect, the present invention further relates to use of the color conversion device (100) of the present invention in an optical device (300) containing at least one functional medium (320, 420, 520) configured to modulate a light or configured to emit light.

Further, in another aspect, the present invention further relates to an optical device (300) containing at least one functional medium (320, 420, 520) configured to modulate a light or configured to emit light, and the color conversion device (100) of the present invention.

Preferable Embodiments

1. A photo-reactive composition comprising at least one light emitting moiety, is configured to show a haze value of 15% or less in the liquid state, preferably said haze value is in the range from 15 to 0.01%, more preferably said haze value is in the range from 10 to 0.1%, even more preferably said haze value is in the range from 5 to 0.1%, and is configured to show the EQE value 20% or more in the cured state, preferably said EQE value is in the range from 20% to 99%, more preferably said EQE value is in the range from 30% to 50%, even more preferably said EQE value is in the range from 30% to 40%, preferably the composition contains scattering particles 5 wt % or less based on the total amount of the composition, more preferably it is in the range from 4 to 0 wt %, even more preferably no scattering particles are in the composition, preferably the composition contains solid particles 5 wt % or less based on the total amount of the composition, wherein said sold particle is not the light emitting moiety, more preferably it is in the range from 4 to 0 wt %, even more preferably no sold particles other than the light emitting moiety are in the composition, preferably it is configured to show a haze value of more than 15% in the cured state, more preferably it is in the range from 16% to 99%, even more preferably it is in the range from 20% to 99%, furthermore preferably it is in the range from 20% to 90%, particularly preferably it is in the range from 30% to 85%.

2. A photo-reactive composition comprising at least one light emitting moiety, is configured to show a haze value of more than 15% in the cured state, more preferably it is in the range from 16% to 99%, even more preferably it is in the range from 20% to 99%, furthermore preferably it is in the range from 20% to 90%, particularly preferably it is in the range from 30% to 85% and is configured to show the EQE value 20% or more, preferably said EQE value is in the range from 20% to 99%, more preferably said EQE value is in the range from 30% to 50%, even more preferably said EQE value is in the range from 30% to 40%, preferably composition contains scattering particles 5 wt % or less based on the total amount of the composition, more preferably it is in the range from 4 to 0 wt %, even more preferably no scattering particles are in the composition, preferably is configured to show a haze value of 15% or less in the liquid state, preferably said haze value is in the range from 15 to 0.01%, more preferably said haze value is in the range from 10 to 0.1%, even more preferably said haze value is in the range from 5 to 0.1%.

3. A photo-reactive composition comprising at least one light emitting moiety, is configured to show a haze value of 15% or less in the liquid state, preferably said haze value is in the range from 15 to 0.01%, more preferably said haze value is in the range from 10 to 0.1%, even more preferably said haze value is in the range from 5 to 0.1%, and is configured to show a haze value of more than 15 in the cured state, more preferably it is in the range from 16% to 99%, even more preferably it is in the range from 20% to 99%, furthermore preferably it is in the range from 20% to 90%, particularly preferably it is in the range from 30% to 85% preferably composition optionally contains scattering particles 5 wt % or less based on the total amount of the composition, more preferably it is in the range from 4 to 0 wt %, even more preferably no scattering particles are in the composition.

4. A photo-reactive composition comprising at least one light emitting moiety, is configured to show the ratio of the haze value in cured state/the haze value in liquid state is more than 1, preferably in the range from 1.1 to 100, more preferably in the range from 2 to 50, even more preferably in the range from 5 to 50 preferably composition optionally contains scattering particles 5 wt % or less based on the total amount of the composition, more preferably it is in the range from 4 to 0 wt %, even more preferably no scattering particles are in the composition.

5. The composition of any one of embodiments 1 to 4, wherein said Haze value is measured at room temperature in air using a photo spectrometer (Perkin Elmer, Lambda 1050) fitted with an integration sphere detector, and a test cell containing the composition as a 15 μm thick layer (in liquid state or in cured solid state) sandwiched between two 0.7 mm thick alkali-free AF glasses, whereas said test cell is or is not fitted in the beam path in front of the integration sphere, to perform the measurement sequence consisting of the following steps T1 to T4 in the wavelength range of 380-780 nm:

(T1) all the light emitted from the light source of the photo spectrometer is collected by the integration sphere which is closed with a white reflector to measure all light emitted by the photo spectrometer, whereas for this step said test cell is not in the beam path in front of the integration sphere;

(T2) the incident light first passes through the sample before being collected in the closed integration sphere to measure all the light passing through the sample, whereas for this step said test cell is placed in the beam path in front of the integration sphere;

(T3) the incident light is allowed to pass through the open integration sphere to determine the fraction of scattered light, whereas for this step said test cell is not in the beam path of the integration sphere;

(T4) light passes first through the sample and is then collected by the opened integration sphere to determine the amount of light scattered by the sample, whereas for this step said test cell is placed in the beam path in front of the integration sphere;

then, said haze value is calculated using the following equation:

$$\text{Haze value}=((T4/T2)-(T3/T1))*100[\%]$$, whereas $T1$-$T4$ are measured over the wavelength range 380-780 nm.

6. The composition of any one of embodiments 1 to 5, wherein said EQE is measured by the following EQE measurement process at room temperature which is based on using an integrating sphere, equipped with a 450 nm excitation light source coupled in via an optical fiber, and a spectrometer (C9920, Hamamatsu photonics), and which consists of a first measurement using air as the reference to detect the incident photons of the excitation light and a second measurement with the sample or test cell placed in front of the integrating sphere in between the opening of the integrating sphere and the exit of the optical fiber to detect the photons incident from the excitation light source transmitted through the sample and the photos emitted from the sample or test cell, whereas for both cases photons exiting the integrating sphere are counted by the spectrometer and EQE and BL calculation is done with the following equations and the number of photons of the excitation light and emission light is calculated by integration over the following wavelength ranges;

$$EQE=\text{Photons [Emission light]/Photons [Excitation light measured without sample in place]};$$

$$BL=\text{Photons [measured without sample in place]/Photons [Excitation light measured without sample in place]};$$

Emission light if green light emitting moieties are used: 480 nm-600 nm,

Emission light if red light emitting moieties are used: 560 nm-680 nm

Excitation light: 430 nm-470 nm.

7. The composition of any one of embodiments 1 to 6, contains a plurality of light emitting moieties, preferably the total amount of the light emitting moieties is in the range from 0.1 wt. % to 90 wt. % based on the total amount of the composition, more preferably from 10 wt. % to 70 wt. %, even more preferably from 30 wt. % to 50 wt. %.

8. The composition of any one of embodiments 1 to 7, further comprises at least a (meth)acrylate monomer, preferably said monomer is selected from a mono-(meth)acrylate monomer, a di-(meth)acrylate monomer or a tri-(meth) acrylate monomer more preferably it is a di-methacrylate monomer or a di-acrylate monomer, tri-methacrylate monomer, tri-acrylate monomer even more preferably it is represented by following chemical formula (I), (I)

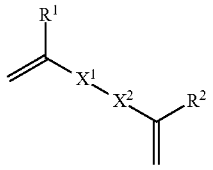

wherein $X^1$ is a non-substituted or substituted alkyl group, aryl group or an alkoxy group or an ester group;

$X^2$ is a non-substituted or substituted alkyl group, aryl group or an alkoxy group or an ester group;

$R^1$ is a hydrogen atom, halogen atom of Cl, Br, or F, methyl group, alkyl group, aryl group, alkoxy group, ester group, or a carboxylic acid group;

$R^2$ is a hydrogen atom, halogen atom of Cl, Br, or F, methyl group, alkyl group, aryl group, alkoxy group, ester group, or a carboxylic acid group;

preferably the symbol $X^1$ is

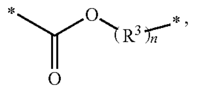

where "*" on the left side of the formula represents the connecting point to the carbon atom of the end group $C{=}CR^1$ of the formula (I) and "*" on the right side represents the connecting point to symbol $X^2$ of the formula (I);

n is 0 or 1;

preferably the symbol $X^2$ is

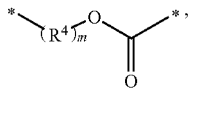

where "*" on the left side of the formula represents the connecting point to symbol X1 of the formula (I) and "*" on the right side represents the connecting point to the end group $C{=}CR^2$ of the formula (I);

m is 0 or 1;

preferably at least m or n is 1;

$R^3$ is a straight alkylene chain or alkoxylene chain having 1 to 25 carbon atoms, a cycloalkane having 3 to 25 carbon atoms or an aryl group having 3 to 25 carbon atoms, preferably $R^3$ is a straight alkylene chain or alkoxylene chain having 1 to 15 carbon atoms, more preferably 1 to 5 carbon atoms, which may be substituted by one or more radicals $R^a$, where one or more non-adjacent $CH_2$ groups may be replaced by $R^aC{=}CR^a$, CC, $Si(R^a)_2$, $Ge(R^a)_2$, $Sn(R^a)_2$, C═O, C═S, C═Se, $C{=}NR^a$, $P({=}O)(R^a)$, SO, SO2, $NR^a$, OS, or $CONR^a$ and where one or more H atoms may be replaced by D, F, Cl, Br, I, CN or $NO_2$;

$R^4$ is a straight alkylene chain or alkoxylene chain having 1 to 25 carbon atoms, a cycloalkane having 3 to 25 carbon atoms or an aryl group having 3 to 25 carbon atoms, preferably $R^4$ is a straight alkylene chain or alkoxylene chain having 1 to 15 carbon atoms, more preferably 1 to 5 carbon atoms, which may be substituted by one or more radicals $R^a$, where one or more non-adjacent $CH_2$ groups may be replaced by $R^aC{=}CR^a$, CC, $Si(R^a)_2$, $Ge(R^a)_2$, $Sn(R^a)_2$, C═O, C═S, C═Se, $C{=}NR^a$, $P({=}O)(R^a)$, SO, SO2, $NR^a$, OS, or $CONR^a$ and where one or more H atoms may be replaced by D, F, Cl, Br, I, CN or $NO_2$;

$R^a$ is at each occurrence, identically or differently, H, D or an alkyl group having 1 to 20 carbon atoms, cyclic alkyl or alkoxy group having 3 to 40 carbon atoms, an aromatic ring system having 5 to 60 carbon ring atoms, or a hetero aromatic ring system having 5 to 60 carbon atoms, wherein H atoms may be replaced by D, F, Cl, Br, I; two or more adjacent substituents $R^a$ here may also form a mono- or polycyclic, aliphatic, aromatic or heteroaromatic ring system with one another.

9. The composition of any one of embodiments 1 to 8, further comprises an another (meth)acrylate monomer which is different from the (meth)acrylate monomer of chemical formula (I), preferably said another (meth)acrylate monomer is a mono-(meth)acrylate monomer, more preferably it is a mono-methacrylate monomer or mono-acrylate monomer, even more preferably it is represented by following chemical formula (II),

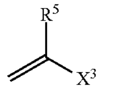

(II)

$X^3$ is a non-substituted or substituted alkyl group, aryl group or an alkoxy group;

preferably the symbol $X^3$ is

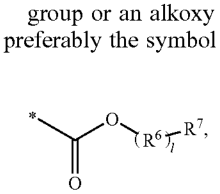

where "*" on the left side of the formula represents the connecting point to the end group $C{=}CR^5$ of the formula (I);

I is 0 or 1;

$R^5$ is a hydrogen atom, halogen atom of Cl, Br, or F, methyl group, alkyl group, aryl group, alkoxy group, ester group, or a carboxylic acid group;

$R^6$ is a straight alkylene chain or alkoxylene chain having 1 to 25 carbon atoms, preferably $R^6$ is a straight alkylene chain or alkoxylene chain having 1 to 15 carbon atoms, more preferably 1 to 5 carbon atoms, which may be substituted by one or more radicals $R^a$, where one or more non-adjacent $CH_2$ groups may be replaced by $R^aC{=}CR^a$, C≡C, $Si(R^a)_2$, $Ge(R^a)_2$, $Sn(R^a)_2$, C═O, C═S, C═Se, $C{=}NR^a$, $P({=}O)(R^a)$, SO, SO2, $NR^a$, OS, or $CONR^a$ and where one or more H atoms may be replaced by D, F, Cl, Br, 1, CN or $NO_2$;

$R^7$ is a straight alkylene chain or alkoxylene chain having 1 to 25 carbon atoms, preferably $R^7$ is a straight alkylene chain or alkoxylene chain having 1 to 15 carbon atoms, more preferably 1 to 5 carbon atoms, which may be substituted by one or more radicals $R^a$, where one or more non-adjacent $CH_2$ groups may be replaced by $R^aC{=}CR^a$, CC, $Si(R^a)_2$, $Ge(R^a)_2$, $Sn(R^a)_2$, C═O, C═S, C═Se, $C{=}NR^a$, $P({=}O)(R^a)$, SO, SO2, $NR^a$, OS, or $CONR^a$ and where one or more H atoms may be replaced by D, F, Cl, Br, I, CN or $NO_2$;

$R^a$ is at each occurrence, identically or differently, H, D or an alkyl group having 1 to 20 carbon atoms, cyclic alkyl or alkoxy group having 3 to 40 carbon atoms, an aromatic ring system having 5 to 60 carbon ring atoms, or a hetero aromatic ring system having 5 to 60 carbon atoms, wherein H atoms may be replaced by D, F, Cl, Br, I; two or more adjacent substituents $R^a$ here may also form a mono- or polycyclic, aliphatic, aromatic or heteroaromatic ring system with one another.

10. The composition of any one of embodiments 1 to 9, wherein the (meth)acrylate monomer of chemical formula (II) is in the composition and the mixing ratio of the (meth)acrylate monomer of chemical formula (I) to the (meth)acrylate monomer of chemical formula (II) is in the range from 1:99 to 99:1 (formula (I):formula (II)), preferably from 5:95 to 50:50, more preferably from 10:90 to 40:60, even more preferably it is from 15:85 to 35:65, preferably at least a purified (meth)acrylate monomer represented by chemical formula (I), (II) is used in the composition, more preferably the (meth)acrylate monomer of chemical formula (I) and the (meth)acrylate monomer of chemical formula (II) are both obtained or obtainable by a purification method.

11. The composition of any one of embodiments 1 to 10, wherein the boiling point (B.P.) of said (meth)acrylate monomer of chemical formula (I) and/or chemical formula (II) is 250° C. or more, preferably the (meth)acrylate monomers of chemical formula (I) and chemical formula (II) are both 250° C. or more, more preferably it is in the range from 250° C. to 350° C., even more preferably from 280° C. to 350° C., further more preferably from 300° C. to 348° C.

12. The composition of any one of embodiments 1 to 11, wherein the viscosity of the composition is 35 cP or less at room temperature, preferably in the range from 1 to 35 cP, more preferably from 2 to 30 cP, even more preferably from 2 to 25 cP.

13. The composition of any one of embodiments 1 to 12, wherein said light emitting moiety comprises a ligand, more preferably said light emitting moiety comprises an alkyl type ligand having carbon atoms 2 to 25.

14. The composition of any one of embodiments 1 to 13, wherein said light emitting moiety is an organic light emitting material and/or an inorganic light emitting material, preferably said organic light emitting materials is an organic dye, or an organic light emitting material for organic light emitting diode device, preferably said inorganic light emitting material is an inorganic phosphor and/or a quantum material.

15. The composition of any one of embodiments 1 to 14, further comprises an additional material selected from one or more members of the group consisting of;

A) another light emitting moiety which is different from the light emitting moiety of claim 1, preferably said light emitting moiety is an organic light emitting material and/or an inorganic light emitting material, more preferably said organic light emitting materials is an organic dye, or an organic light emitting material for organic light emitting diode device, more preferably said inorganic light emitting material is an inorganic phosphor and/or a quantum material, preferably said light emitting moiety comprises a ligand, more preferably said light emitting moiety comprises an alkyl type ligand having carbon atoms 2 to 25;

B) another (meth)acrylate monomer; and

C) optically transparent polymers, anti-oxidants, radical quenchers, photo initiators and/or surfactants.

16. The composition of any one of embodiments 1 to 15, comprises a solvent 10 wt % or less based on the total amount of the composition, more preferably it is 5 wt % or less, more preferably it is a solvent free composition, preferably the composition does not comprise any one of the following solvent selected from one or more members of the group consisting of ethylene glycol monoalkyl ethers, such as, ethylene glycol monomethyl ether, ethylene glycol monoethyl ether, ethylene glycol monopropyl ether, and ethylene glycol monobutyl ether; diethylene glycol dialkyl ethers, such as, diethylene glycol dimethyl ether, diethylene glycol diethyl ether, diethylene glycol dipropyl ether, and diethylene glycol dibutyl ether; propylene glycol monoalkyl ethers, such as, propylene glycol monomethyl ether (PGME), propylene glycol monoethyl ether, and propylene glycol monopropyl ether; ethylene glycol alkyl ether acetates, such as, methyl cellosolve acetate and ethyl cellosolve acetate; propylene glycol alkyl ether acetates, such as, propylene glycol monomethyl ether acetate (PGMEA), propylene glycol monoethyl ether acetate, and propylene glycol monopropyl ether acetate; ketones, such as, methyl ethyl ketone, acetone, methyl amyl ketone, methyl isobutyl ketone, and cyclohexanone; alcohols, such as, ethanol, propanol, butanol, hexanol, cyclo hexanol, ethylene glycol, triethylene glycol and glycerin; esters, such as, ethyl 3-ethoxypropionate, methyl 3-methoxypropionate and ethyl lactate; and cyclic asters, such as, gamma-butyro-lactone; chlorinated hydrocarbons, such as chloroform, dichloromethane, chlorobenzene, trimethyl benzenes such as 1,3,5-trimethylbenzene, 1,2,4-trimethyl benzene, 1,2,3-trimethyl benzene, docecyl benzene, cyclohexylbenzene, 1,2,3,4-tetramethylbenzene, 1,2,3,5-tetramethylbenzene, 3-isopropylbiphenyl, 3-methylbiphenyl, 4-methylbiphenyl and dichlorobenzene, preferably said solvent is propylene glycol alkyl ether acetates, alkyl acetates, ethylene glycol mono-alkyl ethers, propylene glycol, and propylene glycol mono-alkyl ethers.

17. A layer obtained or obtainable from the composition of any one of embodiments 1 to 16 by curing it, preferably said curing is a heat curing and/or photo irradiation curing, preferably said layer being a patterned layer.

18. A layer obtained or obtainable from the composition of any one of embodiments 1 to 16 by curing it, containing at least a matrix material, one light emitting moiety, configured to show a haze value of more than 15%, more preferably it is in the range from 16% to 99%, even more preferably it is in the range from 20% to 99%, furthermore preferably it is in the range from 20% to 90%, particularly preferably it is in the range from 30% to 85%, preferably it has the EQE value 20% or more, more preferably said EQE value is in the range from 20% to 99%, more preferably said EQE value is in the range from 30% to 50%, even more preferably said EQE value is in the range from 30% to 40%, preferably said layer being a patterned layer.

19. A layer containing at least a matrix material, one light emitting moiety and a plurality of voids, configured to show a haze value of more than 15%, more preferably it is in the range from 16% to 99%, even more preferably it is in the range from 20% to 99%, furthermore preferably it is in the range from 20% to 90%, particularly preferably it is in the range from 30% to 85%, preferably it has the EQE value 20% or more, more preferably said EQE value is in the range from 20% to 99%, more preferably said EQE value is in the range from 30% to 50%, even more preferably said EQE value is in the range from 30% to 40%, preferably said void is filled with a gas selected from air or an inert gas, preferably said inert gas is selected from one or more members of the group consisting of $N^2$, Ar, Ne, CO2, He, Kr, Xe, more preferably said void is filled with air or an inert gas of $N_2$, Ar or $CO_2$, preferably said layer being a patterned layer.

20. A layer containing at least a matrix material, and a plurality of light emitting moieties, wherein said layer is configured to show a haze value of more than 15%, more preferably it is in the range from 16% to 99%, even more preferably it is in the range from 20% to 99%, furthermore preferably it is in the range from 20% to 90%, particularly preferably it is in the range from 30% to 85%, resulting from non-uniform distribution of the light emitting moieties in the layer, preferably said layer being a patterned layer.

21. A layer containing at least one light emitting moiety, a matrix material and scattering particles, wherein the total amount of the scattering particles is 4 wt % or less based on the total amount of the solid contents of the layer, preferably it is in the range from 4 to 0 wt %, more preferably it is in the range from 1 to 0 wt %, more preferably the layer does not contain any scattering particles, is configured to achieve the EQE value 20% or more, more preferably said EQE value is in the range from 20% to 99%, more preferably said EQE value is in the range from 30% to 50%, even more preferably said EQE value is in the range from 30% to 40%, for blue-to-green conversion efficiency, preferably the layer is a patterned layer, preferably said layer being a patterned layer.

22. A layer containing at least a matrix material and a plurality of light emitting moieties, contains a $1^{st}$ phase and a $2^{nd}$ phase, wherein said $1^{st}$ phase and said $2^{nd}$ phase are different of each other, and said $1^{st}$ phase has a plurality of aggregates of said light emitting moieties and higher concentration per unit volume in the light emitting moieties than the $2^{nd}$ phase, preferably said unit volume is 1 $cm^3$.

23. The later of any one of embodiments 17 to 22, wherein the layer thickness of the layer is in the range from 1 to 50 um, preferably 5 to 30, more preferably 8 to 20, further more preferably 10-15 um.

24. The later of any one of embodiments 17 to 23, contains a plurality of light emitting moieties, preferably the total amount of the light emitting moieties is in the range from 0.1 wt. % to 90 wt. % based on the total amount of the composition, more preferably from 10 wt. % to 70 wt. %, even more preferably from 30 wt. % to 50 wt. %.

25. Process of fabricating the layer of any one of embodiments 17 to 24, wherein the process comprises at least the following steps;

I) providing a composition of any one of embodiments 1 to 16 onto a substrate, preferably, II) curing the composition, preferably said curing is performed by photo irradiation and/or thermal treatment.

26. A layer obtained or obtainable from the process of embodiment 25.

27. A color conversion device (100) comprising at least a $1^{st}$ pixel (161) partly or fully filled with the layer of any one of embodiments 17 to 24 and 26 comprising at least a matrix material (120) containing a light emitting moiety (110), and a bank (150) comprising at least a polymer material, preferably the color conversion device (100) further contains a supporting medium (170).

28. The device (100) of embodiment 27, wherein the height of the bank (150) is in the range from 0.1 to 100 μm, preferably it is from 1 to 50 μm, more preferably from 1 to 25 μm, furthermore preferably from 5 to 20 μm.

29. The device (100) of embodiment 27 or 28, wherein the layer thickness of the pixel (161) is in the range from 0.1 to 100 μm, preferably it is from 1 to 50 μm, more preferably from 5 to 25 μm.

30. The device (100) of any one of embodiments 27 to 29, further contains a $2^{nd}$ pixel (162), preferably the device (100) contains at least said $1^{st}$ pixel (161), $2^{nd}$ pixel (162) and a $3^{rd}$ pixel (163), more preferably said $1^{st}$ pixel (161) is a red color pixel, the $2^{nd}$ pixel (162) is a green color pixel and the $3^{rd}$ pixel (163) is a blue color pixel, even more preferably the $1^{st}$ pixel (161) contains a red light emitting moiety (110R), the $2^{nd}$ color pixel (162) contains a green light emitting moiety (110G) and the $3^{rd}$ pixel (163) does not contain any light emitting moiety.

31. The device (100) of any one of embodiments 27 to 30 wherein at least one pixel (160) additionally comprises at least one light scattering particle (130) in the matrix material (120), preferably the pixel (160) contains a plurality of light scattering particles (130).

32. The device (100) of any one of embodiments 27 to 31, wherein said $1^{st}$ pixel (161) consists of one pixel or two or more sub-pixels configured to emit red-color when irradiated by an excitation light, more preferably said sub-pixels contains the same light emitting moiety (110).

33. The device (100) of any one of embodiments 27 to 32, wherein the bank (150) is configured to determine the area of said $1^{st}$ pixel (161) and at least a part of the bank (150) is directly contacting to at least a part of the $1^{st}$ pixel (161), preferably said $2^{nd}$ polymer of the bank (150) is directly contacting to at least a part of the $1^{st}$ polymer of the $1^{st}$ pixel (161).

34. The device (100) of any one of embodiments 27 to 33, wherein said bank (150) is photolithographically patterned and said $1^{st}$ pixel (161) is surrounded by the bank (150), preferably said $1^{st}$ pixel (161), the $2^{nd}$ pixel (162) and the $3^{rd}$ pixel (163) are all surrounded by the photolithographically patterned bank (150).

35. Use of the composition of any one of embodiments 1 to 16 for fabricating the layer of any one of embodiments 17 to 26 or the device (100) of any one of embodiments 27 to 34.

36. Method for fabricating a color conversion device (100) of any one of embodiments 27 to 34 containing at least the following steps, preferably in this sequence;

Xi) Providing a bank composition onto a surface of a supporting medium

Xii) Curing the bank composition,

Xiii) Applying photo-patterning to the cured said composition to fabricate bank and a patterned pixel region, Xiv) Providing the composition of any one of embodiments 1 to 16 to at least one pixel region, preferably by ink-jetting, Xv) Curing the composition, preferably said color conversion device (100) further contains a supporting medium (170).

37. The color conversion device (100) obtainable or obtained from the method of embodiment 36.

38. Use of the color conversion device (100) of the present invention in an optical device (300) containing at least one functional medium (320, 420, 520) configured to modulate a light or configured to emit light.

39. An optical device (300) containing at least one functional medium (320, 420, 520) configured to modulate a light or configured to emit light, and the color conversion device (100) of any one of embodiments 27 to 34.

Technical Effects of the Invention

Present invention provides one or more of the following effects: developing a $TiO_2$-free ink with high EQE to solve this problem, providing a QD ink without $TiO_2$ to provide more flexibility for the ink design and selection and concentration of the other ink components, Achieving higher EQE and lower BL for a QD ink without scattering particles, achieving higher haze value of a cured QD ink without scattering particles, and achieving higher haze value of a cured QD ink without scattering particles and higher EQE at the same time possibly realizing lower blue leakage at the same time, improved optical properties of bank, improved compatibility between a bank and a composition containing a light emitting moiety (e.g. QD ink), improved wetting properties and chemical stability towards a composition containing a light emitting moiety, less degradation of the bank structure upon bringing the composition containing a light emitting moiety into contact with the bank, Such degradation may be (partial or complete) dissolution of the bank structure by the QD ink formulation, delamination of the bank structure and/or intermixing of the bank and the QD ink. This would lead to a loss of integrity of the bank structure and/or a loss of the well-defined pixel structure. realizing adequate chemical resistance of the bank so that no degradation is observed upon filling the wells of the bank structure with QD Ink, realizing low curing temperature (e.g. 100° C.) properties of the bank, providing a bank having high resolution and/or excellent light shielding properties. Providing a bank composition configured to be developed even with a low-concentration alkaline developer other than an organic developer and is excellent also in environmental properties, improved homogeneous dispersion of semiconducting light emitting nanoparticles in the composition, improved homogeneous dispersion of scattering particles in the composition, preferably improved homogeneous dispersion of both semiconducting light emitting nanoparticles and scattering particles, more preferably improved homogeneous dispersion of semiconducting light emitting nanoparticles and/or scattering particles without solvent; composition having lower viscosity suitable for inkjet printing, preferably a composition which can keep lower viscosity even if it is mixed with high loading of semiconducting light emitting nanoparticles and/or scattering particles, even more preferably without solvent; composition having lower vaper pressure for large area uniform printing; improved QY/EQE of semiconducting light emitting nanoparticles in the composition, improved QY/EQE of semiconducting light emitting nanoparticles after printing; improved thermal stability; easy printing without clogging at a printing nozzle; easy handling of the composition, improved printing properties; simple fabrication process; improved absorbance of blue light; improved solidity of a later made from the composition after inkjet printing.

The working examples 1-16 below provide descriptions of the present invention, as well as an in-detail description of their fabrication.

WORKING EXAMPLES

Working Example 1: Preparation of Monomer Mixtures 1,6-Hexanediol dimethacrylate (HDDMA) and lauryl acrylate (LA) are stored over molecular sieves 4A. HDDMA is purified by passed through silica gel column prior to use. 4 g of HDDMA and 6 g of LA are mixed in glass vial, thus obtained a monomer mixture. The weight ratio of HDDMA:LA in the monomer mixture is 40:60.

In a same manner as described above, the monomer mixtures of HDDMA:LA (30:70), HDDMA:LA (20:80), NDDA:LA (30:70) are prepared instead of HDDMA:LA (40:60).

Working Example 2: Preparation of QD Monomer Dispersion 10.41 ml of green Cd-free InP based QD solution in toluene (Merck) and 1.02 g of the monomer mixture obtained in working example 1 are mixed in glass flask. Toluene is evaporated under vacuum at 40 deg.C by rotary evaporator, thus obtained 3.06 g of QD monomer dispersion.

Working Example 4: Preparation of QD Ink

The QD monomer dispersion obtained in working example 2, the $TiO_2$ monomer dispersion obtained in working example 3, 1.12 g of the monomer mixture obtained in working example 1, 0.051 g of photo initiator (Omnirad 819) and 0.041 g of antioxidant (Irganox 1010) are mixed in glass vial. The obtained mixture is agitated by applying ultrasonic and then by magnetic stirring to afford 5 g of the QD ink. The composition of the QD ink is as below.

Working Example 5: Fabrication of QD Test Cell for EQE and QY Measurement

The QD inks obtained in working example 4 is injected into a text cell with 15 mm gap and comparative example 5 is also injected into a test cell with same condition and photo-cured by irradiating UV light.

Working Example 6: EQE Measurement

EQE measurement is carried out by using integrating sphere equipped with excitation light by optical fiber (CWL: 450 nm) and spectrometer (C9920, Hamamatsu photonics). To detect the photons of the excitation light, air is used as a reference at room temperature.

The number of photons of light emission from the cell towards the integrating sphere is counted by the spectrometer at room temperature.

EQE is calculated by the following calculation Method.

$$EQE = \text{Photons [Emission light]/Photons [Excitation light]}$$

Wavelength Range for Calculation

Emission: [Green] 480 nm-600 nm, [Red] 560 nm-680 nm

Table 1 shows the EQE measurement results of the QD ink compositions obtained in working example 4.

TABLE 1

| QD | TiO2 | Monomer mixture | Photo initiator | Anti-oxidant | EQE (%) |
|---|---|---|---|---|---|
| 40 | 5 | 53.2 (HDDMA:LA 40:60) | 1 | 0.8 | 25.2% |
| 40 | 5 | 53.2 (HDDMA:LA 30:70) | 1 | 0.8 | 24.8% |
| 40 | 5 | 53.2 (HDDMA:LA 20:80) | 1 | 0.8 | 24.6% |
| 40 | 5 | 53.2 (NDDA:LA 30:70) | 1 | 0.8 | 24.0% |

(wt. %)

The EQE value of the QD ink composition obtained in the comparative example is 22.7.

Working Example 7: Preparation of QD Ink and Fabrication of QD Test Cell

The QD ink composition is prepared in the same manner as described in the previous working examples except for that no TiO2 particles are used.

And QD test cells are fabricated and EQE is measured in the same manner as described in working example 5 and 6 except for that the QD ink obtained in working example 13 is used.

Below table shows the results of the measurements.

| | PWL(nm) | FWHM(nm) | EQE(%) |
|---|---|---|---|
| AES 7.5 w % Before UV cure | 528 | 34 | 6.9 |
| AES 7.5 w % After UV cure | 530 | 35 | 6.7 |
| AES 50 w % Before UV cure | 529 | 34 | 6.8 |
| AES 50 w % After UV cure | 529 | 34 | 6.4 |

Working Example 8: Preparation of QD Ink Composition

The QD ink composition is prepared in the same manner as described above with using the following materials.

| | |
|---|---|
| Green QD (Merck) | 40.0 wt. % |
| LA | 41.6 wt. % |
| HDDMA | 10.4 wt. % |
| Titanium dioxide (scattering particles) | 6.0 wt. % |
| Phosphine oxide, phenylbis(2,4,6-trimethylbenzoyl) (Omnirad(™) 819) | 1.0 wt % |
| Irganox(™) 1010 | 1.0 wt % |

Working Example 9: Preparation of Bank Composition

The bank composition is prepared with using the following materials.

TABLE 2

| | | |
|---|---|---|
| Alkaline soluble polymer | Acryl polymer A | 6.4 wt % |
| | Acryl polymer B | 2.1 wt % |
| Chemical compound (Monomer) | A-DPH (Shin-Nakamura) | 16.2 wt % |
| Radical Initiator | NCI-831 (Adeka) | 0.26 wt % |
| | Irgacure 784 (BASF) | 0.26 wt % |
| Saccharide | Saccharide A | 7.7 wt % |
| Surfactant | RS-72-K (DIC) | 0.08 wt % |
| Solvent | PGMEA | 51.9 wt % |
| | GBL | 13.0 wt % |
| Colorant | Black Pigment | 2.1 wt % |
| Total | | 100% |

Saccharide A: sucrose ethylene oxide adduct

Acryl polymer B: 2-Propenoic acid, 2-methyl-, polymer with 2-hydroxyethyl 2-methyl-2-propenoate, 2-isocyanatoethyl 2-propenoate and methyl 2-methyl-2-propenoate (Natoco).

Acryl polymer A: acrylic randam polymer made from carbon acid monomer and monomer containing at least one aromatic ring group (Shin-Nakajima).

Working Example 10: Device Fabrication

The obtained bank composition is applied onto a bared glass substrate by spin coating, then the coated glass substrate is prebaked on a hot plate at 100° C. for 90 seconds so as to prepare an average film thickness of 13 μm. Exposure is performed using an i-line exposure machine, and cure baking is performed at 230° C. for 30 min. Then, a development is performed using 0.03% KOH for 60 seconds, and rinsing with deionaized pure water is performed for 30 seconds. As a result, a 12 μm bank (C/H) pattern is formed. Finally, sample 1 is obtained.

Then sample 2 is fabricated in the same manner as described above "fabrication of sample 1" except for 100° C. for 30 minutes cure baking condition is applied instead of 230° C. for 30 minutes cure baking condition.

Then sample 2 is obtained.

OD Calculation

The transmittance at the wavelength of 400 to 700 nm of sample 1 and sample 2 are measured with using a Spectrophotometer CM-5 (Konica Minolta, Inc.), and it is converted into the OD.

SEM Analysis

Cross Section SEM analysis of the sample 2 is performed. FIG. 6 show the results of the Cross Section SEM analysis.

FT: 11.5 μm, Taper angle: 98 deg. are observed.

According to the Cross Section SEM analysis, the well-defined pixel structure is observed. It also proves that a low curing temperature (e.g. 100° C.) properties of the bank is very good. Further, the bank composition is well developed even with a low-concentration alkaline developer The process conditions and the obtained OD calculation results are shown in Table 3. It is also confirmed by SEM analysis that the patterns of sample 1 and 2 are formed (OK) without any peeling.

TABLE 3

| | |
|---|---|
| Substrate | Bare glass |
| Surface treatment | No surface treatment |
| Coating recipe | 900 rpm/0.1 s, 160 rpm/10 s, 1000 rpm/0.1 s |
| Bake | 100degC, 90 sec. |
| Expo. | 100, 120 140 mJ |
| Dev. | 0.03% KOH, 60 sec |
| rinse | DIW 30 s |
| Cure baking | 230degC(ref) or 100degC, air, 30 min |
| Film thickness | After dev = 13.0 um/After cure = 12.0 um |
| OD | OD1.96/FT12.0 um (230degCcure Ref)<br>OD1.81/FT12.0 um (100degC cure) |

QD Ink Filing Test

Then, the QD ink obtained in working example 14 is injected into the samples 1 and 2 with 12 mm gap and photo-cured by irradiating UV light.

The obtained samples 1 and 2 are very clear.

According to the cross section SEM analysis, a smooth layer structure without any void in a cured ink and without any aggregation in the cured ink is observed.

And the compatibility between the bank and the cured ink, and the wetting properties and chemical stability towards the QD ink are both very good.

Figure 12:
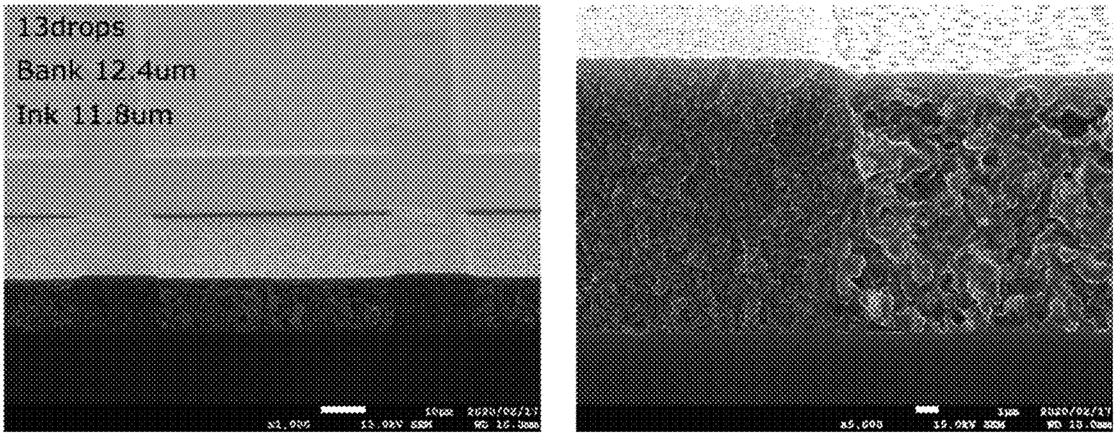
FIG. 12: shows the results of the SEM analysis of working example 10.

According to the SEM analysis, no dissolution, no delamination of the bank structure by the QD ink, no intermixing of the bank and the QD ink are also observed. FIG. 12 shows the results of the SEM analysis.

Working Example 11: Preparation of QD Ink

The QD ink composition (sample A: LA/HDDA 80/20 40% Quantum dots (Merck) with $TiO_2$ particles) is prepared in the same manner as described in the previous working examples except for that HDDA is used instead of HDDMA.

Working Example 12: Preparation of QD Ink

The QD ink composition (Sample B: LA/HDDA 80/20 40% Quantum dots (Merck) with no $TiO_2$) is prepared in the same manner as described in the previous working example 11 except for that no $TiO_2$ particles are used.

Comparative Example 1: Preparation of QD Ink

The QD ink composition (Sample C: LA/TBCH/TMPTA 40% Quantum dots (Merck) with $TiO_2$ particles) is prepared in the same manner as described in the previous working example 11 except for that LA/TBCH/TMPTA are used instead of LA/HDDA.

And in the same manner as described in the working example 12, QD ink composition (Sample D: LA/TBCH/TMPTA 40% Quantum dots (Merck) without $TiO_2$ particles) is prepared except for that LA/TBCH/TMPTA are used instead of LA/HDDA.

Working Example 13: Fabrication of QD Test Cells

The QD inks (Sample A, Sample B) obtained in working examples 11 to 12 and the QD inks obtained in comparative example 1 (Sample C, Sample D) are each independently injected into text cells with 15 mm gap with same condition and photo-cured by irradiating UV light.

Working Example 14: EQE and Haze Measurements

EQE values of the test cells are measured in the same manner as described in working example 6 and said Haze value is measured using a photo spectrometer (Perkin Elmer, Lambda 1050) fitted with an integration sphere detector at room temperature in air condition, and a test cell containing the composition as a 15 μm thick layer (in liquid state or in cured solid state) sandwiched between two 0.7 mm thick AF glasses is fitted in the beam path in front of the integration sphere, then the measurement is performed by the following steps T1 to T4 in this sequence in the wavelength range of 380-780 nm:

(T1) all the light emitted from the light source of the photo spectrometer is collected by the integration sphere which is closed with a white reflector to measure it by the photo spectrometer, said test cell is not in the beam path in front of the integration sphere;

(T2) the incident light first passes through the sample before being collected in the closed integration sphere to measure all the light passing through the sample, said test cell is placed in the beam path in front of the integration sphere;

(T3) the incident light is allowed to pass through the open integration sphere to determine the amount of scattered light, said test cell is not in the beam path of the integration sphere;

(T4) light passes first through the sample and is then collected by the opened integration sphere, said test cell is placed in the beam path in front of the integration sphere; the amount of light scattered by the sample is determined in this configuration;

then, said haze value is calculated using the following equation:

$$\text{Haze value}=((T4/T2)-(T3/T1))*100[\%].$$

Ink 1: LA/HDDA 80/20 40% Quantum dots (Merck)

Ink 2: LA/TBCH/TMPTA 40% Quantum dots (Merck)

TABLE 1

| | EQE | BL | Haze 380-780 | Haze 550-780 |
|---|---|---|---|---|
| Sample A: Ink 1 + 6% TiO2 | 26.0 | 15.9 | 83% | 81% |
| Sample B: Ink 1 no TiO2 | 24.4 | 24.0 | 35% | 23% |
| Sample C: Ink 2 + 6% TiO2 (REFERENCE) | 22.5 | 28.2 | 69% | 69% |
| Sample D: Ink 2 no TiO2 | 9.8 | 56.8 | 4% | 1% |

The reference sample C based on Ink 2 containing 6% wt % $TiO_2$ scattering particles (Sample C: Reference) exhibits EQE and BL values of 22.5% and 28.2%, respectively. When the $TiO_2$ is omitted from Ink 2 (Sample D), lower EQE value of 9.8% and higher BL of 56.8% is obtained, resulting from the lack of light scattering ability of the QD-PCC layer.

For our newly developed Ink 1 shows higher EQE and lower BL even without the addition of $TiO_2$ as demonstrated by sample B.

To further demonstrate that the effect on EQE and BL results from the light scattering ability of the QD-PCC layer, we measure corresponding haze values. Haze is defined as the amount of light that is diffused or scattered when passing through a transparent material.

We calculate Haze for two different wavelength regions to account for the emissive nature of the QD-PCC layer.

The reference sample C based on Ink 1 containing 6% w $TiO_2$ scattering particles exhibits rather high Haze values of 83% and 81%, respectively. When omitting the $TiO_2$, Haze drops to 4% and 1%, respectively in agreement with the very transparent appearance of the sample and low EQE.

In contrast, our newly developed ink 2 can achieve significantly higher Haze values of up to 35% and 23%, respectively, even though no $TiO_2$ scattering particles are employed in this sample (Sample B). Correspondingly the sample appears hazy and exhibits comparatively high EQE and low BL.

TABLE 2

| | Haze 380-780 Before curing | Haze 380-780 After curing | CIH | Haze 550-780 Before curing | Haze 550-780 After curing | CIH |
|---|---|---|---|---|---|---|
| Sample B: Ink 1 no TIO2 | 4% | 35% | 9 | 1% | 23% | 23 |
| Sample D: Ink 2 no TiO2 (REFERENCE) | 4% | 4% | 1 | 1% | 1% | 1 |

What is more is that in our design, the scattering centers in the QD-PCC layer are formed during the curing of the layer and are not yet present in the ink itself. This eases printability of the ink and completely overcomes the problem of sedimentation faced in case of using scattering particles.

The effect can be elucidated by measuring haze of the thin layers before and after the curing. To illustrate the effect, we calculate the curing induced haze value (CIH) which is defined as the ratio of the haze value of the QD-PCC layer after curing and the haze value of the QD-PCC layer before curing. A value larger than one indicates the anticipated formation of scattering centers upon curing.

In our reference formulation without scattering particles (Sample D) haze does not change upon curing and the CIH is 1 for both wavelength ranges.

In contrast to that our new ink (Sample B) exhibits a strong increase in haze and CIH values of 9 and 23, respectively.

The invention claimed is:

1. A photo-reactive composition comprising at least one light emitting moiety, which is configured to show a haze value of 15% or less in the liquid state; or is configured to show a haze value of more than 15% in the cured state; or is configured to show the ratio of the haze value in cured state to the haze value in liquid state is more than 1;

wherein the composition comprises a (meth)acrylate monomer of formula (I)

(I)

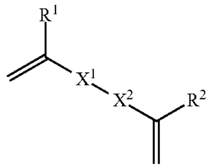

wherein $R^1$ is a hydrogen atom, halogen atom of Cl, Br or F, methyl group, alkyl group, aryl group, alkoxy group, ester group or a carboxylic acid group;

$R^2$ is a hydrogen atom, halogen atom of Cl, Br or F, methyl group, alkyl group, aryl group, alkoxy group, ester group or a carboxylic acid group;

$X^1$ is

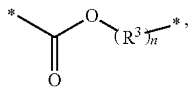

where "*" on the left side of the formula represents the connecting point to the carbon atom of the end group C═$CR^1$ of the formula (I) and "*" on the right side represents the connecting point to symbol $X^2$ of the formula (I);

n is 0 or 1;

$X^2$

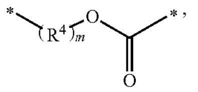

where "*" on the left side of the formula represents the connecting point to symbol $X^1$ of the formula (I) and "*" on the right side represents the connecting point to the end group C═$CR^2$ of the formula (I);

m is 0 or 1;

$R^3$ is a straight alkylene chain or alkoxylene chain having 1 to 25 carbon atoms, a cycloalkane having 3 to 25 carbon atoms or an aryl group having 3 to 25 carbon atoms, which may be substituted by one or more radicals $R^a$, where one or more non-adjacent $CH_2$ groups may be replaced by $R^a$C═$CR^a$, C≡C, $Si(R^a)_2$, $Ge(R^a)_2$, $Sn(R^a)_2$, C═O, C═S, C═Se, C═$NR^a$, P(═O)($R^a$), SO, $SO_2$, $NR^a$, OS, or $CONR^a$, and where one or more H atoms may be replaced by D, F, Cl, Br, I, CN or $NO_2$;

$R^4$ is a straight alkylene chain or alkoxylene chain having 1 to 25 carbon atoms, a cycloalkane having 3 to 25 carbon atoms or an aryl group having 3 to 25 carbon atoms, which may be substituted by one or more radicals $R^a$, where one or more non-adjacent $CH_2$ groups may be replaced by $R^a$C═$CR^a$, C≡C, $Si(R^a)_2$, $Ge(R^a)_2$, $Sn(R^a)_2$, C═O, C═S, C═Se, C═$NR^a$, P(═O)($R^a$), SO, $SO_2$, $NR^a$, OS, or $CONR^a$, and where one or more H atoms may be replaced by D, F, Cl, Br, I, CN or $NO_2$;

$R^a$ is at each occurrence, identically or differently, H, D or an alkyl group having 1 to 20 carbon atoms, cyclic alkyl or alkoxy group having 3 to 40 carbon atoms, an aromatic ring system having 5 to 60 carbon ring atoms, or a hetero aromatic ring system having 5 to 60 carbon atoms, wherein H atoms may be replaced by D, F, Cl, Br or I; wherein two or more adjacent substituents $R^a$ may also form a mono- or polycyclic, aliphatic, aromatic or heteroaromatic ring system with one another; and a (meth)acrylate monomer of formula (II)

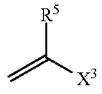

(II)

wherein $X^3$ is

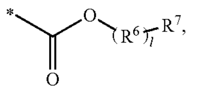

where "*" on the left side of the formula represents the connecting point to the end group C═$CR^5$ of the formula (I);

I is 0 or 1;

$R^5$ is a hydrogen atom, halogen atom of Cl, Br or F, methyl group, alkyl group, aryl group, alkoxy group, ester group or a carboxylic acid group;

$R^6$ is a straight alkylene chain or alkoxylene chain having 1 to 25 carbon atoms, which may be substituted by one or more radicals $R^a$, and where one or more H atoms may be replaced by D, F, Cl, Br, I, CN or $NO_2$;

$R^7$ is a straight alkylene chain or alkoxylene chain having 1 to 25 carbon atoms, which may be substituted by one or more radicals $R^a$, and where one or more H atoms may be replaced by D, F, Cl, Br, I, CN or $NO_2$;

$R^a$ is at each occurrence, identically or differently, H, D or an alkyl group having 1 to 20 carbon atoms, cyclic alkyl or alkoxy group having 3 to 40 carbon atoms, an aromatic ring system having 5 to 60 carbon ring atoms, or a hetero aromatic ring system having 5 to 60 carbon atoms, wherein H atoms may be replaced by D, F, Cl, Br or I; and wherein two or more adjacent substituents $R^a$ may also form a mono- or polycyclic, aliphatic, aromatic or heteroaromatic ring system with one another.

2. The photo-reactive composition comprising at least one light emitting moiety according to claim 1, which is configured to show a haze value of more than 15% in the cured state.

3. The photo-reactive composition comprising at least one light emitting moiety according to claim 1, which is configured to show a haze value of 15% or less in the liquid state.

4. The photo-reactive composition comprising at least one light emitting moiety according to claim 1, which is configured to show the ratio of the haze value in cured state to the haze value in liquid state is more than 1.

5. The composition according to claim 1, wherein the mixing ratio of the (meth)acrylate monomer of formula (I) to the (meth)acrylate monomer of formula (II) is 1:99 to 99:1.

6. The composition according to claim 5, wherein the boiling point of the (meth)acrylate monomer of formula (I) and/or of formula (II) is 250° C. or more.

7. The composition according to claim 1, wherein the viscosity of the composition is 35 cP or less at room temperature.

8. The composition according to claim 1, wherein said light emitting moiety comprises a ligand.

9. A layer obtained from the composition according to claim 1, by curing said composition.

10. A layer obtained from the composition according to claim 1, by curing said composition, and containing at least a matrix material, one light emitting moiety, and configured to show a haze value of more than 15%.

11. A layer obtained from the composition according to claim 1, further containing scattering particles, wherein the total amount of the scattering particles is 4 wt % or less based on the total amount of the solid contents of the layer;

or a $1^{st}$ phase and a $2^{nd}$ phase, wherein the $1^{st}$ phase and the $2^{nd}$ phase are different from each other, and the $1^{st}$ phase has a plurality of aggregates of the at least one light emitting moiety and higher concentration per unit volume in the at least one light emitting moiety than the $2^{nd}$ phase.

12. The layer according to claim 11 containing at least a matrix material, and wherein the layer is configured to show a haze value of more than 15%.

13. The layer according to claim 11 containing the at least one light emitting moiety, a matrix material and scattering particles, wherein the total amount of the scattering particles is 4 wt % or less based on the total amount of the solid contents of the layer.

14. The layer according to claim 11 containing at least a matrix material and a plurality of light emitting moieties, contains a $1^{st}$ phase and a $2^{nd}$ phase, wherein said $1^{st}$ phase and said $2^{nd}$ phase are different from each other, and said $1^{st}$ phase has a plurality of aggregates of said light emitting moieties and higher concentration per unit volume in the light emitting moieties than the $2^{nd}$ phase.

15. The layer according to claim 11, having a layer thickness of 1 to 50 μm.

16. A process of fabricating the layer according to claim 11, comprising at least the following steps;

I) providing a composition onto a substrate, which composition is a photo-reactive composition comprising at least one light emitting moiety, which is configured to show a haze value of 15% or less in the liquid state;

or is configured to show a haze value of more than 15% in the cured state;

or is configured to show the ratio of the haze value in cured state to the haze value in liquid state is more than 1, and II) curing the composition.

17. A color conversion device comprising at least a $1^{st}$ pixel partly or fully filled with the layer according to claim 11 comprising at least a matrix material containing a light emitting moiety, and a bank comprising at least a polymer material.

18. A method for fabricating a color conversion device of claim 17 containing at least the following steps;

Xi) providing a bank composition onto a surface of a supporting medium,

Xii) curing the bank composition,

Xiii) applying photo-patterning to the cured composition to fabricate bank and a patterned pixel region, Xiv) providing a composition to at least one pixel region, which composition is a photo-reactive composition comprising at least one light emitting moiety, which is configured to show a haze value of 15% or less in the liquid state;

or is configured to show a haze value of more than 15% in the cured state;

or is configured to show the ratio of the haze value in cured state to the haze value in liquid state is more than 1, and Xv) curing the composition.

19. An optical device containing at least one functional medium configured to modulate a light or configured to emit light, and the color conversion device of claim 17.

20. The composition according to claim 8, wherein the ligand is an alkyl type ligand having carbon atoms 2 to 25.

* * * * *